United States Patent
Aoki

(10) Patent No.: US 9,473,721 B2
(45) Date of Patent: Oct. 18, 2016

(54) SOLID-STATE IMAGE CAPTURE DEVICE AND IMAGE CAPTURE DEVICE

(71) Applicant: OLYMPUS CORPORATION, Tokyo (JP)

(72) Inventor: Jun Aoki, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 0 days.

(21) Appl. No.: 14/809,622

(22) Filed: Jul. 27, 2015

(65) Prior Publication Data

US 2015/0334330 A1  Nov. 19, 2015

Related U.S. Application Data

(63) Continuation of application No. PCT/JP2014/050145, filed on Jan. 8, 2014.

(30) Foreign Application Priority Data

Jan. 31, 2013  (JP) ................................ 2013-016757

(51) Int. Cl.
*H04N 5/3745* (2011.01)
*H04N 5/372* (2011.01)
(Continued)

(52) U.S. Cl.
CPC ...... *H04N 5/3745* (2013.01); *H01L 27/14603* (2013.01); *H01L 27/14634* (2013.01); *H04N 5/238* (2013.01); *H04N 5/23212* (2013.01); *H04N 5/23296* (2013.01); *H04N 5/3698* (2013.01); *H04N 5/372* (2013.01)

(58) Field of Classification Search
None
See application file for complete search history.

(56) References Cited

U.S. PATENT DOCUMENTS 6,441,851 B1 * 8/2002 Yonemoto .............. H04N 3/155 348/294
6,674,470 B1 * 1/2004 Tanaka ................... H04N 3/155 348/302

(Continued)

FOREIGN PATENT DOCUMENTS

JP  2012-079861 A  4/2012
JP  2012-186404 A  9/2012

(Continued)

OTHER PUBLICATIONS

International Search Report dated Feb. 10, 2014, issued in counterparrt application No. PCT/JP2014/050145 (3 pages).

*Primary Examiner* — Michael Osinski
(74) *Attorney, Agent, or Firm* — Westerman, Hattori, Daniels & Adrian, LLP

(57) ABSTRACT

A solid-state image capture device includes a plurality of pixels and a first substrate and a second substrate in which circuit elements constitutes the pixels are disposed and which are electrically connected by a connection unit. The pixels includes: photoelectric conversion elements disposed in the first substrate and generating signals corresponding to amounts of incident light; sample hold capacities disposed in the second substrate and holding output signals corresponding to the signals generated by the photoelectric conversion elements; and a clamp capacitor disposed in the second substrate, shared by the plurality of pixels, and clamping voltages of the output signals held in the plurality of sample hold capacities. The sample hold capacities and the clamp capacitor are capacities having a structure in which two sheets of metal electrodes having a quadrangular flat plate shape are opposite to each other.

7 Claims, 12 Drawing Sheets

(51) Int. Cl.
*H04N 5/369* (2011.01)
*H01L 27/146* (2006.01)
*H04N 5/232* (2006.01)
*H04N 5/238* (2006.01)

(56) References Cited

U.S. PATENT DOCUMENTS

| | | | | |
|---|---|---|---|---|
| 6,710,803 | B1* | 3/2004 | Kang | H04N 5/3575 348/245 |
| 6,795,121 | B2* | 9/2004 | Matsunaga | H01L 27/14609 257/E27.132 |
| 7,646,412 | B2* | 1/2010 | Hisamatsu | H04N 5/185 348/222.1 |
| 7,659,518 | B2* | 2/2010 | Adachi | A61B 6/4233 250/370.09 |
| 8,319,875 | B2* | 11/2012 | Masuyama | H04N 3/155 348/241 |
| 2001/0033337 | A1* | 10/2001 | Sakuragi | H04N 5/32 348/302 |
| 2001/0040635 | A1* | 11/2001 | Fossum | G11C 19/282 348/308 |
| 2003/0117510 | A1* | 6/2003 | Sakurai | H04N 5/3577 348/308 |
| 2004/0195491 | A1* | 10/2004 | Machida | H04N 5/3575 250/208.1 |
| 2004/0239786 | A1* | 12/2004 | Masuyama | H04N 3/155 348/294 |
| 2008/0224676 | A1* | 9/2008 | Kudo | H03K 5/08 323/282 |
| 2009/0184253 | A1* | 7/2009 | Adachi | A61B 6/4233 250/370.09 |
| 2011/0013062 | A1* | 1/2011 | Yamashita | H01L 27/14609 348/294 |
| 2012/0228474 | A1 | 9/2012 | Sato | |
| 2013/0175652 | A1 | 7/2013 | Yamazaki et al. | |
| 2015/0206910 | A1* | 7/2015 | Kato | H01L 27/14643 250/208.1 |

FOREIGN PATENT DOCUMENTS

JP  2012-257095 A  12/2012
JP  2013-009301 A  1/2013

* cited by examiner

SOLID-STATE IMAGE CAPTURE DEVICE AND IMAGE CAPTURE DEVICE

CROSS REFERENCE TO RELATED APPLICATIONS

This application is a continuation application based on a PCT Patent Application No. PCT/JP2014/050145, filed Jan. 8, 2014, whose priority is claimed on Japanese Patent Application No. 2013-016757, filed Jan. 31, 2013, the entire content of which are hereby incorporated by reference.

BACKGROUND OF THE INVENTION

1. Field of the Invention

The present invention relates to a solid-state image capture device having a plurality of pixels and a first substrate and a second substrate in which circuit elements constituting the pixels are disposed and which are electrically connected by a connection unit, and an image capture device.

2. Description of the Related Art

In recent years, video cameras, electronic still cameras, and the like have come into wide general use. In such cameras, charge coupled device (CCD)-type and amplification-type solid-state image capture devices are used. An amplification-type solid-state image capture device guides signal charges generated and accumulated by a photoelectric conversion unit of a pixel on which light is incident to an amplification unit provided for the pixel, and the amplification unit outputs an amplified signal from the pixel. In the amplification-type solid-state image capture device, a plurality of such pixels are disposed in the form of a two-dimensional matrix. The amplification-type solid-state image capture device is, for example, a complementary metal oxide semiconductor (CMOS)-type solid-state image capture device using a CMOS transistor, and the like.

Typically, in a general CMOS-type solid-state image capture device, a method of sequentially reading out signal charges generated by the photoelectric conversion units of respective pixels arranged in the form of a two-dimensional matrix row by row is employed. In this method, an exposure timing at the photoelectric conversion unit of each pixel is determined by the start and the end of reading out of signal charges, and thus respective rows have different exposure timings. For this reason, when such a CMOS-type solid-state image capture device is used to capture a subject in rapid movement, the subject is distorted in a captured image.

In order to remove this distortion of a subject, a simultaneous image capture function (a global shutter function) that realizes simultaneity of accumulation of signal charges has been proposed. Also, uses of a CMOS-type solid-state image capture device having the global shutter function are increasing. In the CMOS-type solid-state image capture device having the global shutter function, signal charges generated by photoelectric conversion units are generally stored until a readout is performed, and thus it is necessary to have a storage capacitor unit having a light-blocking property. After exposing all pixels simultaneously, such an existing CMOS-type solid-state image capture device simultaneously transfers signal charges generated by respective photoelectric conversion units to respective storage capacitor units in all the pixels to temporarily store the signal charges, and sequentially converts the signal charges into pixel signals to read out the pixel signals at a predetermined readout timing.

However, in the existing CMOS-type solid-state image capture device having the global shutter function, it is necessary to manufacture the photoelectric conversion units and the storage capacitor unit on the same plane of the same substrate, and an increase in a chip area is not avoidable. Further, there is a problem in that, during a standby time until the signal charges accumulated in the storage capacitor unit are read out, the quality of a signal is degraded by noise resulting from light or noise resulting from a leakage current (dark current) generated in the storage capacitor unit.

In order to solve this problem, Japanese Unexamined Patent Application, First Publication No. 2012-257095 (hereinafter referred to as Patent Literature 1) discloses a method of preventing an increase in a chip area and reducing noise by means of a solid-state image capture device in which a first substrate having photoelectric conversion units formed therein and a second substrate having analog memories (corresponding to sample hold capacities of the present invention) formed therein to accumulate signal charges generated by the photoelectric conversion unit are bonded together. In the solid-state image capture device disclosed in Patent Literature 1, a clamp capacitor for removing noise, such as reset noise generated in the first substrate and the like, by a sample hold operation is installed. Also, in the solid-state image capture device disclosed in Patent Literature 1, the clamp capacitor is shared by four pixels.

Patent Literature 1 does not disclose how the sample hold capacities which accumulate signal charges and the clamp capacitor for removing noise are disposed. FIG. 13A and FIG. 13B show an example of the disposition of the sample hold capacities and the clamp capacitor when the second substrate is seen two-dimensionally. Four sample hold capacities 1231, 1232, 1233, and 1234 corresponding to four respective pixels and a clamp capacitor 1260 shared by the four pixels have a structure in which two sheets of flat plate-shaped electrodes (an upper electrode and a lower electrode) formed of a metal are opposite to each other. In order to increase a gain for a signal, the area of the clamp capacitor 1260 is larger than the areas of the sample hold capacities 1231, 1232, 1233, and 1234.

In FIG. 13A, parasitic capacitances C101, C102, C103, C104, C105, C106, C107, and C108 are shown. The parasitic capacitance C101 is a parasitic capacitance between the sample hold capacitor 1231 and the clamp capacitor 1260. The parasitic capacitance C102 is a parasitic capacitance between the sample hold capacitor 1232 and the clamp capacitor 1260. The parasitic capacitance C103 is a parasitic capacitance between the sample hold capacitor 1233 and the clamp capacitor 1260. The parasitic capacitance C104 is a parasitic capacitance between the sample hold capacitor 1234 and the clamp capacitor 1260. The parasitic capacitance C105 is a parasitic capacitance between the sample hold capacitor 1231 and the sample hold capacitor 1232. The parasitic capacitance C106 is a parasitic capacitance between the sample hold capacitor 1232 and the sample hold capacitor 1233. The parasitic capacitance C107 is a parasitic capacitance between the sample hold capacitor 1233 and the sample hold capacitor 1234. The parasitic capacitance C108 is a parasitic capacitance between the sample hold capacitor 1234 and the clamp capacitor 1260.

Since the sample hold capacities 1231, 1232, 1233, and 1234 are formed in almost the same shape and the distances between the sample hold capacities 1231, 1232, 1233, and 1234 and the clamp capacitor 1260 are almost the same, the parasitic capacitances C101, C102, C103, and C104 are almost the same. Also, since the sample hold capacities 1231, 1232, 1233, and 1234 are formed in almost the same shape and the distances between the sample hold capacities 1231, 1232, 1233, and 1234 are almost the same, the parasitic capacitances C105, C106, and C107 are almost the same. However, since the shape of the clamp capacitor 1260 differs from the shapes of the sample hold capacities 1231, 1232, 1233, and 1234, the parasitic capacitance C108 differs from the parasitic capacitances C105, C106, and C107.

In FIG. 13B, parasitic capacitances C111, C112, C113 and C114 are shown. The parasitic capacitance C111 is a parasitic capacitance between a sample hold capacitor 1231 and a sample hold capacitor 1232. The parasitic capacitance C112 is a parasitic capacitance between the sample hold capacitor 1232 and a sample hold capacitor 1233. The parasitic capacitance C113 is a parasitic capacitance between the sample hold capacitor 1233 and a sample hold capacitor 1234. The parasitic capacitance C114 is a parasitic capacitance between the sample hold capacitor 1234 and a clamp capacitor 1260.

Since the sample hold capacities 1231, 1232, 1233, and 1234 are formed in almost the same shape and the distances between the sample hold capacities 1231, 1232, 1233, and 1234 are almost the same, the parasitic capacitances C111, C112, and C113 are almost the same. However, since the shape of the clamp capacitor 1260 differs from the shapes of the sample hold capacities 1231, 1232, 1233, and 1234, the parasitic capacitance C114 differs from the parasitic capacitances C111, C112, and C113.

SUMMARY

According to a first aspect of the present invention, a solid-state image capture device is a solid-state image capture device having a plurality of pixels and a first substrate and a second substrate in which circuit elements constituting the pixels are disposed and which are electrically connected by a connection unit, wherein the pixels includes: photoelectric conversion elements disposed in the first substrate and generating signals corresponding to amounts of incident light; sample hold capacities disposed in the second substrate and holding output signals corresponding to the signals generated by the photoelectric conversion elements; and a clamp capacitor disposed in the second substrate, shared by the plurality of pixels, and clamping voltages of the output signals held in the plurality of sample hold capacities, the sample hold capacities and the clamp capacitor are capacities having a structure in which two sheets of metal electrodes having a quadrangular flat plate shape are opposite to each other, and in the plurality of pixels sharing the clamp capacitor, distances between two adjacent sample hold capacities are identical, lengths of one sides of two adjacent sample hold capacities are identical, distances between the respective sample hold capacities and the clamp capacitor are identical, and lengths of one sides of the sample hold capacities opposite to the clamp capacitor are identical.

According to a second aspect of the present invention, in the solid-state image capture device relating to the first aspect, the plurality of sample hold capacities included in the plurality of pixels sharing the clamp capacitor may be disposed along one identical side of the clamp capacitor.

According to a third aspect of the present invention, in the solid-state image capture device relating to the first aspect, some of the sample hold capacities among the plurality of sample hold capacities included in the plurality of pixels sharing the clamp capacitor may be disposed along a first side of the clamp capacitor, and remaining sample hold capacities may be disposed along a second side of the clamp capacitor different from the first side.

According to a fourth aspect of the present invention, in the solid-state image capture device relating to the third aspect, a number of sample hold capacities disposed along the first side of the clamp capacitor may be equal to a number of sample hold capacities disposed along the second side of the clamp capacitor.

According to a fifth aspect of the present invention, in the solid-state image capture device relating to the first aspect, the clamp capacitor and the sample hold capacities may be disposed in two dimensions in units of groups including the clamp capacitor and the plurality of sample hold capacities included in the plurality of pixels sharing the clamp capacitor, some sample hold capacities among the plurality of sample hold capacities included in the plurality of pixels sharing the clamp capacitor included in a first group may be disposed along one side of the clamp capacitor included in the first group, and remaining sample hold capacities may be disposed along one side of the clamp capacitor included in a second group different from the first group.

According to a sixth aspect of the present invention, in the solid-state image capture device relating to the fifth aspect, a number of sample hold capacities disposed along the one side of the clamp capacitor included in the first group and a number of sample hold capacities disposed along the one side of the clamp capacitor included in the second group may be identical.

According to a seventh aspect of the present invention, an image capture device may include the solid-state image capture device relating to the first aspect.

DETAILED DESCRIPTION OF THE PREFERRED EMBODIMENTS

Figure 1:
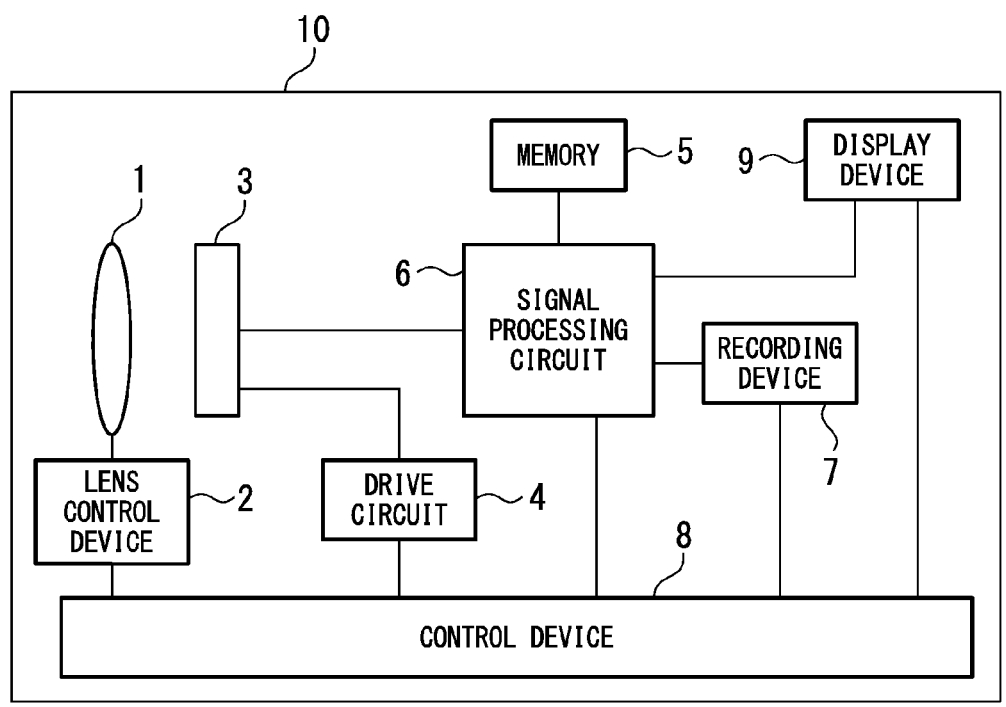
FIG. 1 is a block diagram showing a configuration of an image capture device to which a solid-state image capture device relating to an embodiment of the present invention is applied.

Hereinafter, with reference to the drawings, embodiments of the present invention are described. FIG. 1 shows a configuration of a digital camera as an example of an image capture device to which a solid-state image capture device relating to an embodiment of the present invention is applied. An image capture device relating to an embodiment of the present invention may be electronic equipment having an image capture function, and may also be a digital video camera, an endoscope, and the like instead of a digital camera. A digital camera 10 shown in FIG. 1 has a lens unit 1, a lens control device 2, a solid-state image capture device 3, a drive circuit 4, a memory 5, a signal processing circuit 6, a recording device 7, a control device 8, and a display device 9.

The lens unit 1 has a zoom lens and a focus lens, and images light from a subject on a light receiving surface of the solid-state image capture device 3 as a subject image. The lens control device 2 controls zooming, the focus, and the aperture of the lens unit 1. Light captured through the lens unit 1 is imaged on the light receiving surface of the solid-state image capture device 3. The solid-state image capture device 3 converts the subject image imaged on the light receiving surface into an image signal and outputs the image signal. In the light receiving surface of the solid-state image capture device 3, a plurality of pixels are two-dimensionally arranged in a row direction and a column direction.

The drive circuit 4 drives the solid-state image capture device 3, and controls operation of the solid-state image capture device 3. The memory 5 temporarily stores image data. The signal processing circuit 6 performs previously determined processing on the image signal output from the solid-state image capture device 3. The processing performed by the signal processing circuit 6 includes amplification of the image signal, various correction of the image data, compression of the image data, and the like.

The recording device 7 is constituted by a semiconductor memory or the like for recording or reading out the image data, and is embedded in the digital camera 10 in a removable state. The display device 9 performs display of a moving image (a live view image), display of a still image, display of a moving image or a still image recorded in the recording device 7, display of a state of the digital camera 10, and the like.

The control device 8 performs overall control of the digital camera 10. Operation of the control device 8 is defined in a program stored in a ROM embedded in the digital camera 10. The control device 8 reads out this program, and performs various kinds of control according to content defined in the program.

Figure 2:
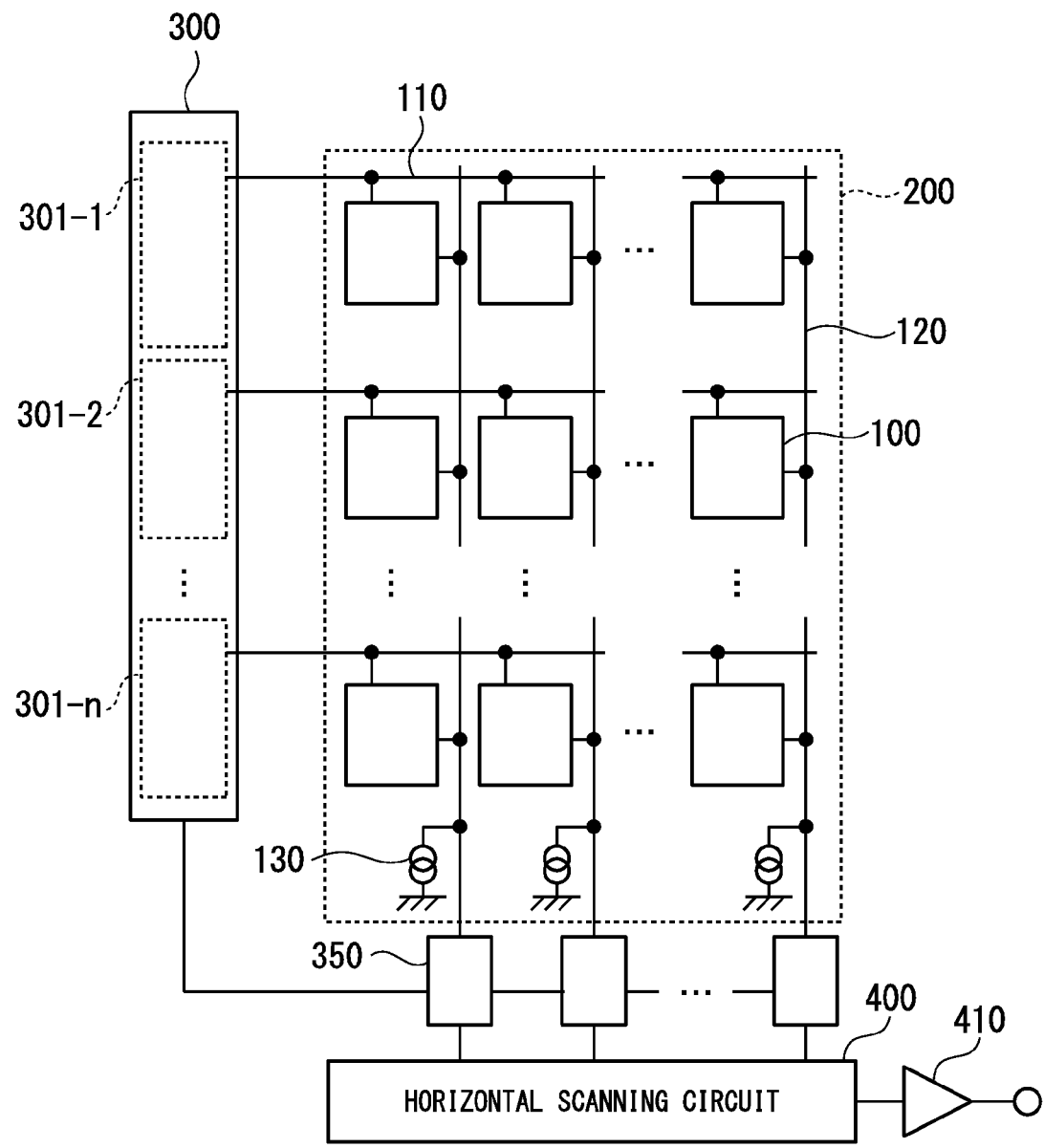
FIG. 2 is a block diagram showing a configuration of a solid-state image capture device relating to an embodiment of the present invention.

FIG. 2 shows a configuration of the solid-state image capture device 3. The solid-state image capture device shown in FIG. 2 has a pixel unit 200 (a pixel array), a vertical scanning circuit 300, column processing circuits 350, a horizontal scanning circuit 400, and an output amplifier 410. The arrangement positions of respective circuit elements shown in FIG. 2 do not necessarily coincide with actual arrangement positions.

The pixel unit 200 has pixels 100 arranged in the form of a two-dimensional matrix and current sources 130 provided in respective columns. In the present embodiment, a region consisting of all pixels of the solid-state image capture device 3 is set as a readout target region of pixel signals, but a part of the region consisting of all the pixels of the solid-state image capture device 3 may be set as the readout target region. It is preferable for the readout target region to at least include all the pixels of an effective pixel region. Also, the readout target region may include optical black pixels (pixels from which light is blocked at all times) disposed outside the effective pixel region. A pixel signal read out from an optical black pixel is used to, for example, correct a dark current component.

The vertical scanning circuit 300 performs drive control of the pixel unit 200 in units of rows. In order to perform this drive control, the vertical scanning circuit 300 includes a number of unit circuits 301-1, 301-2, . . . , and 301-$n$ ($n$ is the number of rows) corresponding to the number of rows.

Each unit circuit 301-$i$ ($i$=1, 2, . . . , and n) outputs a control signal for controlling pixels 100 of one row to a signal line 110 provided for each row. The signal line 110 is connected to the pixels 100 and supplies the control signal output from the unit circuit 301-$i$ to the pixels 100. Although FIG. 2 shows the signal line 110 corresponding to each row as one line, each signal line 110 includes a plurality of signal lines. Signals of pixels 100 of a row selected by a control signal are set to be output to a vertical signal line 120 which is provided for each column.

The current sources 130 are connected to the vertical signal lines 120, and constitute source follower circuits together with amplification transistors (second amplification transistors 241, 242, 243, and 244 which will be described later) in the pixels 100. The column processing circuits 350 perform signal processing, such as noise suppression and the like, on pixel signals output to the vertical signal lines 120. The horizontal scanning circuit 400 chronologically outputs pixel signals of pixels 100 of one row which have been output to the vertical signal lines 120 and processed by the column processing circuits 350 to the output amplifier 410 in order of arrangement in a horizontal direction. The output amplifier 410 amplifies the pixel signals output from the horizontal scanning circuit 400, and outputs the amplified pixel signals to the outside of the solid-state image capture device 3 as image signals.

Figure 3:
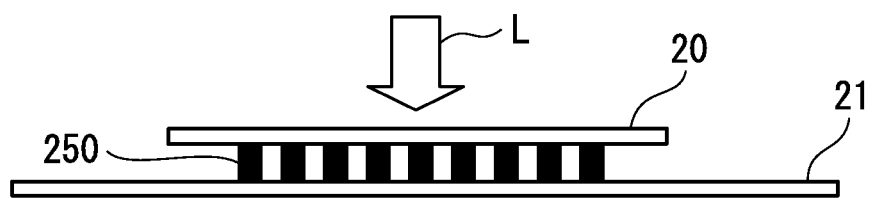
FIG. 3 is a cross-sectional view of a solid-state image capture device relating to an embodiment of the present invention.

FIG. 3 shows a cross-sectional structure of the solid-state image capture device 3. The solid-state image capture device 3 has a structure in which two sheets of substrates (a first substrate 20 and a second substrate 21), in which circuit elements (photoelectric conversion elements, transistors, capacities, and the like) constituting the pixels 100 are disposed, overlap. The circuit elements which constitute the pixels 100 are distributed and disposed in the first substrate 20 and the second substrate 21. The first substrate 20 and the second substrate 21 are electrically connected so that an electric signal can be transferred between the two sheets of substrates when the pixels 100 are driven.

Photoelectric conversion elements are formed in a main surface of a side irradiated with light L between two main surfaces (surfaces having relatively larger surface areas than side surfaces) of the first substrate 20, and the light with which the first substrate 20 is irradiated is incident on the photoelectric conversion elements. Connection units 250 for connecting to the second substrate 21 are formed in a main surface on the opposite side of the main surface on the side irradiated with the light L between the two main surfaces of the first substrate 20. Signals based on signal charges generated by the photoelectric conversion elements disposed in the first substrate 20 are output to the second substrate 21 through the connection units 250. In an example shown in FIG. 3, the main surface areas of the first substrate 20 and the second substrate 21 are different, but the main surface areas of the first substrate 20 and the second substrate 21 may be the same.

In addition to the pixels 100, the vertical scanning circuit 300, the column processing circuits 350, the horizontal scanning circuit 400, and the output amplifier 410 may each be disposed in any of the first substrate 20 and the second substrate 21. Also, circuit elements constituting each of the vertical scanning circuit 300, the column processing circuits 350, the horizontal scanning circuit 400, and the output amplifier 410 may be distributed and disposed in the first substrate 20 and the second substrate 21.

Figure 4:
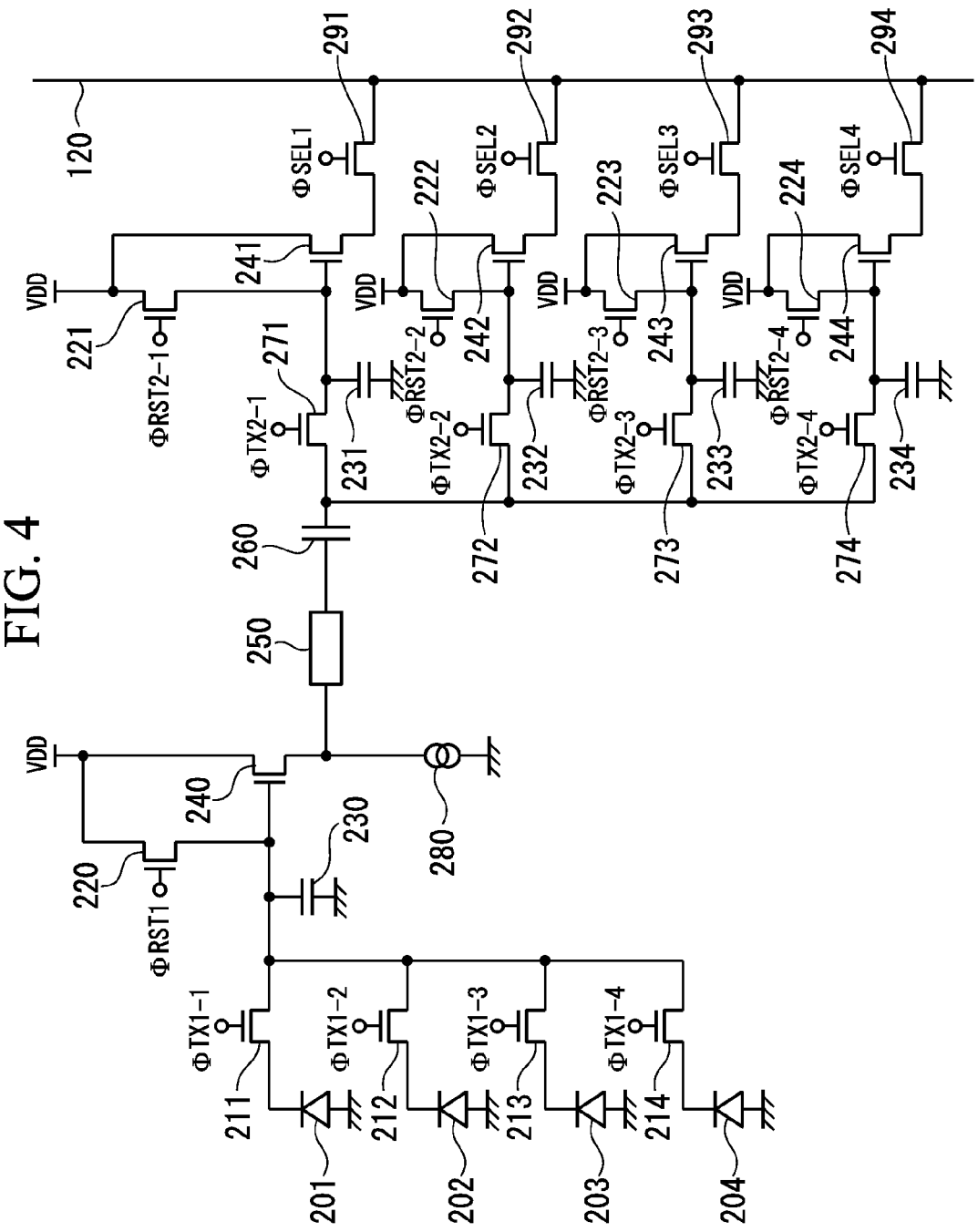
FIG. 4 is a circuit diagram showing a circuit configuration of pixels of a solid-state image capture device relating to an embodiment of the present invention.

FIG. 4 shows a circuit configuration of a pixel cell consisting of four pixels 100. In the present embodiment, an example in which some circuit elements are shared by four pixels lined up in a vertical direction is described. The pixel cell consisting of four pixels 100 has photoelectric conversion elements 201, 202, 203, and 204, first transmission transistors 211, 212, 213, and 214, a charge holding unit 230 (floating diffusion), a first reset transistor 220, a first amplification transistor 240, a current source 280, a clamp capacitor 260, second transmission transistors 271, 272, 273, and 274, second reset transistors 221, 222, 223, and 224, sample hold capacities 231, 232, 233, and 234, second amplification transistors 241, 242, 243, and 244, and selection transistors 291, 292, 293, and 294. The arrangement positions of respective circuit elements shown in FIG. 4 do not necessarily coincide with actual arrangement positions.

The pixel cell includes circuit elements of the four pixels 100. A first pixel has the photoelectric conversion element 201, the first transmission transistor 211, the charge holding unit 230, the first reset transistor 220, the first amplification transistor 240, the current source 280, the clamp capacitor 260, the second transmission transistor 271, the second reset transistor 221, the sample hold capacitor 231, the second amplification transistor 241, and the selection transistor 291. A second pixel has the photoelectric conversion element 202, the first transmission transistor 212, the charge holding unit 230, the first reset transistor 220, the first amplification transistor 240, the current source 280, the clamp capacitor 260, the second transmission transistor 272, the second reset transistor 222, the sample hold capacitor 232, the second amplification transistor 242, and the selection transistor 292.

A third pixel has the photoelectric conversion element 203, the first transmission transistor 213, the charge holding unit 230, the first reset transistor 220, the first amplification transistor 240, the current source 280, the clamp capacitor 260, the second transmission transistor 273, the second reset transistor 223, the sample hold capacitor 233, the second amplification transistor 243, and the selection transistor 293. A fourth pixel has the photoelectric conversion element 204, the first transmission transistor 214, the charge holding unit 230, the first reset transistor 220, the first amplification transistor 240, the current source 280, the clamp capacitor 260, the second transmission transistor 274, the second reset transistor 224, the sample hold capacitor 234, the second amplification transistor 244, and the selection transistor 294. The charge holding unit 230, the first reset transistor 220, the first amplification transistor 240, the current source 280, and the clamp capacitor 260 are shared by the four pixels 100.

One ends of the photoelectric conversion elements 201, 202, 203, and 204 are grounded. The drain terminals of the first transmission transistors 211, 212, 213, and 214 are connected to the other ends of the photoelectric conversion elements 201, 202, 203, and 204. The gate terminals of the first transmission transistors 211, 212, 213, and 214 are connected to the vertical scanning circuit 300, so that transmission pulses $\phi$TX1-1, $\phi$TX1-2, $\phi$TX1-3, and $\phi$TX1-4 are supplied.

One end of the charge holding unit 230 is connected to the source terminals of the first transmission transistors 211, 212, 213, and 214, and the other end of the charge holding unit 230 is grounded. The drain terminal of the first reset transistor 220 is connected to a power supply voltage VDD, and the source terminal of the first reset transistor 220 is connected to the source terminals of the first transmission transistors 211, 212, 213, and 214. The gate terminal of the first reset transistor 220 is connected to the vertical scanning circuit 300, so that a reset pulse $\phi$RST1 is supplied.

The drain terminal of the first amplification transistor 240 is connected to the power supply voltage VDD. A gate terminal which is an input portion of the first amplification transistor 240 is connected to the source terminals of the first transmission transistors 211, 212, 213, and 214. One end of the current source 280 is connected to the source terminal of the first amplification transistor 240, and the other end of the current source 280 is grounded. For example, a transistor which has a drain electrode connected to the source terminal of the first amplification transistor 240, a grounded source terminal, and a gate terminal connected to the vertical scanning circuit 300 may constitute the current source 280. One end of the clamp capacitor 260 is connected to the source terminal of the first amplification transistor 240 and the one end of the current source 280 through a connection unit 250.

The drain terminals of the second transmission transistors 271, 272, 273, and 274 are connected to the other end of the clamp capacitor 260. The gate terminals of the second transmission transistors 271, 272, 273, and 274 are connected to the vertical scanning circuit 300, so that transmission pulses $\phi$TX2-1, $\phi$TX2-2, $\phi$TX2-3, and $\phi$TX2-4 are supplied. The drain terminals of the second reset transistors 221, 222, 223, and 224 are connected to the power supply voltage VDD, and the source terminals of the second reset transistors 221, 222, 223, and 224 are connected to the source terminals of the second transmission transistors 271, 272, 273, and 274. The gate terminals of the second reset transistors 221, 222, 223, and 224 are connected to the vertical scanning circuit 300, so that reset pulses $\phi$RST2-1, $\phi$RST2-2, $\phi$RST2-3, and $\phi$RST2-4 are supplied.

One ends of the sample hold capacities 231, 232, 233, and 234 are connected to the source terminals of the second transmission transistors 271, 272, 273, and 274, and the other ends of the sample hold capacities 231, 232, 233, and 234 are grounded. The drain terminals of the second amplification transistors 241, 242, 243, and 244 are connected to the power supply voltage VDD. Gate terminals which constitute input portions of the second amplification transistors 241, 242, 243, and 244 are connected to the source terminals of the second transmission transistors 271, 272, 273, and 274. The drain terminals of the selection transistors 291, 292, 293, and 294 are connected to the source terminals of the second amplification transistors 241, 242, 243, and 244, and the source terminals of the selection transistors 291, 292, 293, and 294 are connected to a vertical signal line 120. The gate terminals of the selection transistors 291, 292, 293, and 294 are connected to the vertical scanning circuit 300, so that selection pulses φSEL1, φSEL2, φSEL3, and φSEL4 are supplied. In relation to each of the transistors described above, polarities may be reversed, and the source terminal and the drain terminal may be reversed from the above description.

The photoelectric conversion elements 201, 202, 203, and 204 are, for example, photodiodes that generate (yield) signal charges based on the amounts of incident light and hold and accumulate the generated (yielded) signal charges. The first transmission transistors 211, 212, 213, and 214 are transistors that transmit the signal charges accumulated in the photoelectric conversion elements 201, 202, 203, and 204 to the charge holding unit 230. On/off of the first transmission transistors 211, 212, 213, and 214 is controlled by the transmission pulses φTX1-1, φTX1-2, φTX1-3, and φTX1-4 from the vertical scanning circuit 300. The charge holding unit 230 is a floating diffusion capacitance that temporarily holds and accumulates the signal charges transmitted from the photoelectric conversion elements 201, 202, 203, and 204.

The first reset transistor 220 is a transistor that resets the charge holding unit 230. On/off of the first reset transistor 220 is controlled by the reset pulse φRST1 from the vertical scanning circuit 300. By simultaneously turning on the first reset transistor 220 and the first transmission transistors 211, 212, 213, and 214, it is possible to reset the photoelectric conversion elements 201, 202, 203, and 204. Reset of the charge holding unit 230/reset of the photoelectric conversion elements 201, 202, 203, and 204 serves to set states (electric potentials) of the charge holding unit 230/the photoelectric conversion elements 201, 202, 203, and 204 to a reference state (a reference potential, a reset level) by controlling the amounts of charges accumulated in the charge holding unit 230/the photoelectric conversion elements 201, 202, 203, and 204.

The first amplification transistor 240 is a transistor that outputs an amplified signal obtained by amplifying a signal based on signal charges, which are input to the gate terminal and have been accumulated in the charge holding unit 230, from the source terminal. The current source 280 functions as a load of the first amplification transistor 240, and supplies current for driving the first amplification transistor 240 to the first amplification transistor 240. The first amplification transistor 240 and the current source 280 constitute a source follower circuit.

The clamp capacitor 260 is a capacitor that clamps (fixes) the voltage level of the amplified signal output from the first amplification transistor 240. The second transmission transistors 271, 272, 273, and 274 are transistors that sample-hold the voltage level of the other end of the clamp capacitor 260 and accumulate the voltage level in the sample hold capacities 231, 232, 233, and 234. On/off of the second transmission transistors 271, 272, 273, and 274 is controlled by the transmission pulses φTX2-1, φTX2-2, φTX2-3, and φTX2-4 from the vertical scanning circuit 300.

The second reset transistors 221, 222, 223, and 224 are transistors that reset the sample hold capacities 231, 232, 233, and 234. On/off of the second reset transistors 221, 222, 223, and 224 is controlled by the reset pulses φRST2-1, φRST2-2, φRST2-3, and φRST2-4 from the vertical scanning circuit 300. Reset of the sample hold capacities 231, 232, 233, and 234 serves to set states (electric potentials) of the sample hold capacities 231, 232, 233, and 234 to a reference state (a reference potential, a reset level) by controlling the amounts of charges accumulated in the sample hold capacities 231, 232, 233, and 234. The sample hold capacities 231, 232, 233, and 234 hold and accumulate analog signals sample-held by the second transmission transistors 271, 272, 273, and 274.

The capacities of the sample hold capacities 231, 232, 233, and 234 are set to be larger than the capacitor of the charge holding unit 230. In the sample hold capacities 231, 232, 233, and 234, it is more preferable to use a metal insulator metal (MIM) capacitor which is a small capacitor of leakage current (dark current) per unit area. Accordingly, resistance to noise is improved, and a high quality signal is obtained.

The second amplification transistors 241, 242, 243, and 244 are transistors that output amplified signals obtained by amplifying signals based on signal charges, which are input to the gate terminals and have been accumulated in the sample hold capacities 231, 232, 233, and 234, from the source terminals. The second amplification transistors 241, 242, 243, and 244 and a current source 130 connected to the vertical signal line 120 constitute source follower circuits. The selection transistors 291, 292, 293, and 294 are transistors that select the pixels 100 and transfer the outputs of the second amplification transistors 241, 242, 243, and 244 to the vertical signal line 120. On/off of the selection transistors 291, 292, 293, and 294 is controlled by the selection pulses φSEL1, φSEL2, φSEL3, and φSEL4 from the vertical scanning circuit 300.

Among the circuit elements shown in FIG. 4, the photoelectric conversion elements 201, 202, 203, and 204, the first transmission transistors 211, 212, 213, and 214, the charge holding unit 230, the first reset transistor 220, the first amplification transistor 240, and the current source 280 are disposed in the first substrate 20. Also, the clamp capacitor 260, the second transmission transistors 271, 272, 273, and 274, the second reset transistors 221, 222, 223, and 224, the sample hold capacities 231, 232, 233, and 234, the second amplification transistors 241, 242, 243, and 244, and the selection transistors 291, 292, 293, and 294 are disposed in the second substrate 21.

Between the first substrate 20 and the second substrate 21, the connection units 250 are disposed. The amplified signal output from the first amplification transistor 240 of the first substrate 20 is output to the second substrate 21 through the connection unit 250.

In FIG. 4, the connection unit 250 is disposed in a path among the source terminal of the first amplification transistor 240, the one end of the current source 280, and the one end of the clamp capacitor 260, but is not limited thereto. The connection unit 250 may be disposed at any position on an electrically connected path from the first transmission transistors 211, 212, 213, and 214 to the second transmission transistors 271, 272, 273, and 274.

For example, the connection unit 250 may be disposed in a path among the source terminals of the first transmission transistors 211, 212, 213, and 214, the one end of the charge holding unit 230, the source terminal of the first reset transistor 220, and the gate terminals of the first amplification transistor 240. Alternatively, the connection unit 250 may be disposed in a path among the other end of the clamp capacitor 260 and the drain terminals of the second transmission transistors 271, 272, 273, and 274.

Figure 5:
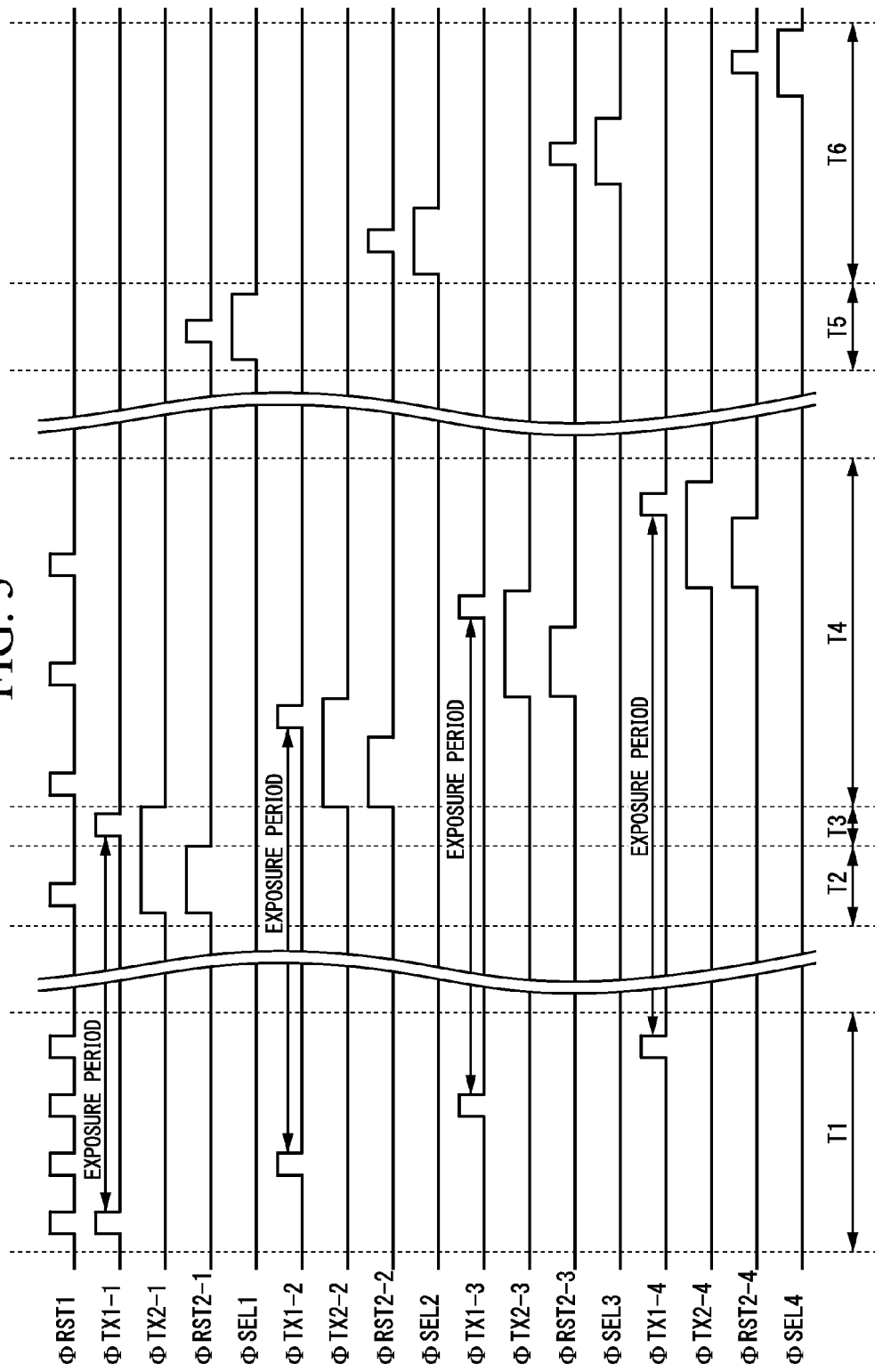
FIG. 5 is a timing chart showing operation of pixels of a solid-state image capture device relating to an embodiment of the present invention.

Next, operation of pixels 100 will be described with reference to FIG. 5. FIG. 5 shows control signals supplied from the vertical scanning circuit 300 to pixels 100 in each row. Operation will be described below in units of pixel cells consisting of the four pixels shown in FIG. 4.

(Operation of Time Period T1) First, the reset pulse φRST1 changes from a "Low (L)" level to a "High (H)" level, so that the first reset transistor 220 is turned on. At the same time, the transmission pulse φTX1-1 changes from the "L" level to the "H" level, so that the first transmission transistor 211 is turned on. Accordingly, the photoelectric conversion element 201 of the first pixel is reset.

Subsequently, the reset pulse φRST1 and the transmission pulse φTX1-1 change from the "H" level to the "L" level, so that the first reset transistor 220 and the first transmission transistor 211 are turned off. Accordingly, reset of the photoelectric conversion element 201 of the first pixel is finished, and exposure (accumulation of signal charges) of the first pixel is started. In the same way as described above, the photoelectric conversion element 202 of the second pixel, the photoelectric conversion element 203 of the third pixel, and the photoelectric conversion element 204 of the fourth pixel are reset in sequence, and exposure of the respective pixels is started. In FIG. 4, at timings at which the transmission pulses φTX1-1, φTX1-2, φTX1-3, and φTX1-4 change to the "H" level, the reset pulse φRST1 changes to the "H" level, but during the entire time period in which the photoelectric conversion elements 201, 202, 203, and 204 are reset, the reset pulse φRST1 may be at the "H" level.

(Operation of Time Period T2)

Subsequently, the reset pulse φRST2-1 changes from the "L" level to the "H" level, so that the second reset transistor 221 is turned on. Accordingly, the sample hold capacitor 231 is reset. At the same time, the transmission pulse φTX2-1 changes from the "L" level to the "H" level, so that the second transmission transistor 271 is turned on. Accordingly, the electric potential of the other end of the clamp capacitor 260 is reset to the power supply voltage VDD, and also the second transmission transistor 271 starts sample-holding the electric potential of the other end of the clamp capacitor 260.

Subsequently, the reset pulse φRST1 changes from the "L" level to the "H" level, so that the first reset transistor 220 is turned on. Accordingly, the charge holding unit 230 is reset. Subsequently, the reset pulse φRST1 changes from the "H" level to the "L" level, so that the first reset transistor 220 is turned off. Accordingly, reset of the charge holding unit 230 is finished. A timing at which reset of the charge holding unit 230 is performed may be in the exposure period, but it is possible to further reduce noise caused by leakage current of the charge holding unit 230 by performing reset of the charge holding unit 230 at a timing immediately before the end of the exposure period.

Subsequently, the reset pulse φRST2-1 changes from the "H" level to the "L" level, so that the second reset transistor 221 is turned off. Accordingly, reset of the sample hold capacitor 231 is finished. At this point in time, the clamp capacitor 260 is clamping an amplified signal (an amplified signal after reset of the charge holding unit 230) output from the first amplification transistor 240.

(Operation of Time Period T3)

First, the transmission pulse φTX1-1 changes from the "L" level to the "H" level, so that the first transmission transistor 211 is turned on. Accordingly, signal charges accumulated in the photoelectric conversion element 201 are transferred to the charge holding unit 230 through the first transmission transistor 211 and accumulated in the charge holding unit 230. Accordingly, exposure (accumulation of signal charges) of the first pixel is finished. A time period from the start of exposure of the first pixel in the time period T1 to the end of exposure of the first pixel in the time period T3 is the exposure period (signal accumulation period). Subsequently, the transmission pulse φTX1-1 changes from the "H" level to the "L" level, so that the first transmission transistor 211 is turned off.

Subsequently, the transmission pulse φTX2-1 changes from the "H" level to the "L" level, so that the second transmission transistor 271 is turned off. Accordingly, the second transmission transistor 271 finishes sample-holding the electric potential of the other end of the clamp capacitor 260.

(Operation of Time Period T4)

The operations of the time periods T2 and T3 described above are operations of the first pixel. In the time period T4, the same operations as the operations of the time periods T2 and T3 are performed for each of the second pixel, the third pixel, and the fourth pixel. It is more preferable to equalize the lengths of exposure periods of the respective pixels.

A change in the electric potential of the one end of the sample hold capacitor 231 will be described below. Changes in the electric potentials of the one ends of the sample hold capacities 232, 233, and 234 are also the same as will be described below. When a change in the electric potential of the one end of the charge holding unit 230 made by transferring the signal charges from the photoelectric conversion element 201 to the charge holding unit 230 after reset of the charge holding unit 230 is finished is ΔVfd and the gain of the first amplification transistor 240 is α1, a change ΔVamp1 in the electric potential of the source terminal of the first amplification transistor 240 made by transferring the signal charges from the photoelectric conversion element 201 to the charge holding unit 230 is α1×ΔVfd.

When the total gain of the sample hold capacitor 231 and the second transmission transistor 271 is α2, a change ΔVmem in the electric potential of the one end of the sample hold capacitor 231 made by sample holding of the second transmission transistor 271 after the signal charges are transferred from the photoelectric conversion element 201 to the charge holding unit 230 is α2×ΔVamp1, that is, α1×α2×ΔVfd. ΔVfd is the amount of change in the electric potential of the one end of the charge holding unit 230 made by transmission of the signal charges, and does not include reset noise which is generated by resetting the charge holding unit 230. Therefore, the second transmission transistor 271 performs sample holding, so that influence of noise generated in the photoelectric conversion element 201 can be reduced.

The electric potential of the one end of the sample hold capacitor 231 at the point in time at which reset of the sample hold capacitor 231 is finished is the power supply voltage VDD, and thus an electric potential Vmem of the one end of the sample hold capacitor 231 which is sample-held by the second transmission transistor 271 after the signal charges are transferred from the photoelectric conversion element 201 to the charge holding unit 230 is Expression (1) given below. In Expression (1), ΔVmem<0, and ΔVfd<0.

$$Vmem = VDD + \Delta Vmem$$

$$= VDD + \alpha 1 \times \alpha 2 \times \Delta Vfd \quad (1)$$

Also, α2 is Expression (2) given below. In Expression (2), CL is the capacitor value of the clamp capacitor 260, and CSH is the capacitor value of the sample hold capacitor 231. In order to decrease a reduction in gain, it is preferable for the capacitor CL of the clamp capacitor 260 to be larger than the capacitor CSH of the sample hold capacitor 231.

$$\alpha 2 = \frac{CL}{CL+CSH} \qquad (2)$$

(Operation of Time Period T5)

In the time period T5, signals based on signal charges accumulated in the sample hold capacities 231, 232, 233, and 234 are sequentially read out from respective rows. First, the readout of a signal from the first pixel is performed. The selection pulse φSEL1 changes from the "L" level to the "H" level, so that the selection transistor 291 is turned on. Accordingly, a signal based on the electric potential Vmem shown in Expression (1) is output to the vertical signal line 120 through the selection transistor 291.

Subsequently, the reset pulse φRST2-1 changes from the "L" level to the "H" level, so that the second reset transistor 221 is turned on. Accordingly, the sample hold capacitor 231 is reset, and a signal based on the electric potential of the one end of the sample hold capacitor 231 upon the reset is output to the vertical signal line 120 through the selection transistor 291.

Subsequently, the reset pulse φRST2-1 changes from the "H" level to the "L" level, so that the second reset transistor 221 is turned off. Subsequently, the selection pulse φSET1 changes from the "H" level to the "L" level, so that the selection transistor 291 is turned off.

A column processing circuit 350 generates a differential signal by calculating a difference between the signal based on the electric potential Vmem shown in Expression (1) and the signal based on the electric potential of the one end of the sample hold capacitor 231 upon resetting the sample hold capacitor 231. This differential signal is a signal based on a difference between the electric potential Vmem shown in Expression (1) and the power supply voltage VDD, and a signal based on the difference ΔVfd between the electric potential of the one end of the charge holding unit 230 immediately after the signal charges accumulated in the photoelectric conversion element 201 is transferred to the charge holding unit 230 and the electric potential of the charge holding unit 230 immediately after the one end of the charge holding unit 230 is reset. Therefore, it is possible of obtain signal components in which noise components caused by resetting the sample hold capacitor 231 and noise components caused by resetting the charge holding unit 230 are suppressed based on the signal charges accumulated in the photoelectric conversion element 201.

The signal output from the column processing circuit 350 is output to the output amplifier 410 by the horizontal scanning circuit 400. The output amplifier 410 processes the signal output from the horizontal scanning circuit 400 and outputs the processed signal as an image signal. In this way, the readout of a signal from the first pixel is finished.

(Operation of Time Period T6)

Subsequently, the same operations as the operations of the first pixel in the time period T5 are performed for each of the second pixel, the third pixel, and the fourth pixel.

In the above operations, the charge holding unit 230 is required to hold signal charges which are transferred from the photoelectric conversion elements 201, 202, 203, and 204 to the charge holding unit 230 until the readout timing of each pixel 100. When noise is generated in a time period in which the charge holding unit 230 holds the signal charges, the noise overlaps the signal charges held by the charge holding unit 230, and signal quality (S/N) is degraded.

Main factors generating noise in the time period (hereinafter referred to as a holding period) in which the charge holding unit 230 holds the signal charges are charges caused by leakage current (hereinafter referred to as leakage charges) of the charge holding unit 230 and charges (hereinafter referred to as photo-charges) resulting from light incident on portions other than the photoelectric conversion elements 201, 202, 203, and 204. When leakage current and photo-charges generated in a unit time are qid and qpn, respectively, and the length of the holding period is tc, noise charges Qn generated in the holding period are (qid+qpn)tc.

The capacitor of the charge holding unit 230 is Cfd, the capacities of the sample hold capacities 231, 232, 233, and 234 are Cmem, and a Cmem-to-Cfd ratio (Cmem/Cfd) is A. Also, as described above, the gain of the first amplification transistor 240 is a1, and the total gain of the sample hold capacities 231, 232, 233, and 234 and the second transmission transistor 271, 272, 273, 274 is α2. When signal charges generated in the photoelectric conversion elements 201, 202, 203, and 204 in the exposure period are Qph, signal charges held in the sample hold capacities 231, 232, 233, and 234 after the end of the exposure period are A×α1×α2×Qph.

Signals based on signal charges transferred from the photoelectric conversion elements 201, 202, 203, and 204 to the charge holding unit 230 are sample-held by the second transmission transistors 271, 272, 273, and 274 and stored in the sample hold capacities 231, 232, 233, and 234. Therefore, the time from when the signal charges are transferred to the charge holding unit 230 until the signal charges are stored in the sample hold capacities 231, 232, 233, and 234 is short, and noise generated in the charge holding unit 230 can be ignored. Assuming that noise generated in the time period in which the sample hold capacities 231, 232, 233, and 234 hold the signal charges is Qn, which is the same as above, S/N is A×α1×α2×Qph/Qn.

Meanwhile, as in related art, when signal charges held in a capacitor storage unit are read out from a pixel through an amplification transistor, S/N is Qph/Qn. Therefore, S/N of the present embodiment is A×α1×α2 times S/N of the related art. By setting the capacitor values of the sample hold capacities 231, 232, 233, and 234 such that A×α1×α2 is greater than 1 (for example, by setting the capacitor values of the sample hold capacities 231, 232, 233, and 234 to be sufficiently larger than the capacitor value of the charge holding unit 230), it is possible to reduce degradation of signal quality.

Figure 6:
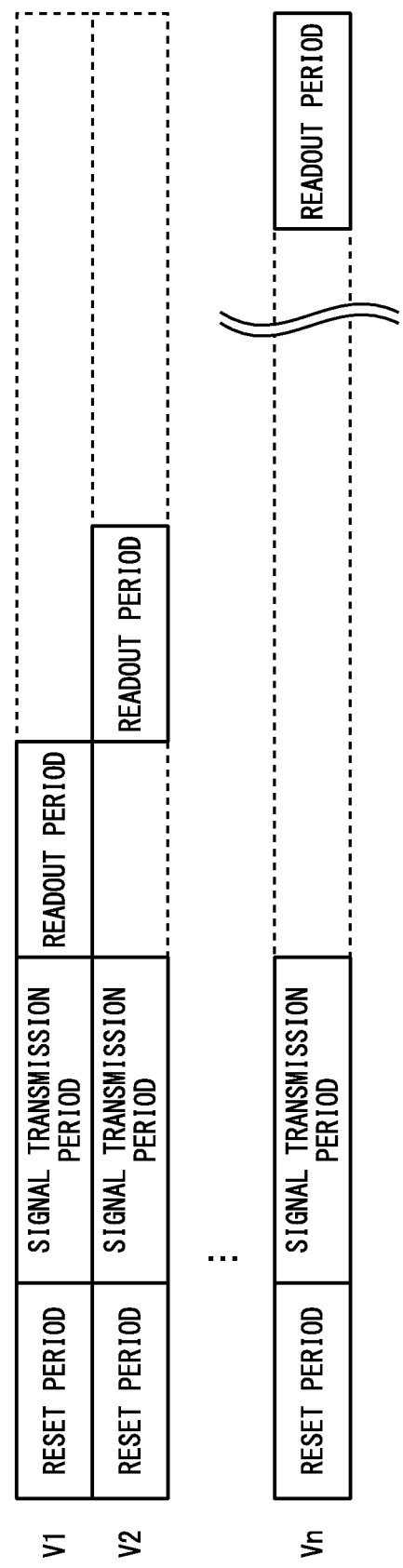
FIG. 6 is a timing chart showing operation of pixels of a solid-state image capture device relating to an embodiment of the present invention.

In the present embodiment, while the operation timings of pixel cells at the same position in the vertical direction (hereinafter referred to as a vertical position) are the same, the operation timings of pixel cells at different vertical positions are different. FIG. 6 schematically shows the operation timings of pixel cells at different vertical positions V1, V2, . . . , and Vn. Positions in the vertical direction of FIG. 6 show vertical positions in the arrangement of pixel cells, and positions in the horizontal direction show time positions.

A reset period corresponds to the time period T1 of FIG. 5, a signal transmission period corresponds to the time periods T2, T3, and T4 of FIG. 5, and a readout period corresponds to the time periods T5 and T6 of FIG. 5. As shown in FIG. 6, pixel cells at different vertical positions have the same reset period and signal transmission period. On the other hand, pixel cells at different vertical positions have different readout periods. In the operations described above, exposure timings of respective pixels in the same pixel cell are different, but it is possible to realize simultaneity of exposure in all the pixel cell.

In the solid-state image capture device of the present embodiment, some circuit elements are shared among a plurality of pixels, and thus it is possible to reduce a chip area compared to a case in which circuit elements are not shared among a plurality of pixels. Further, the first amplification transistor 240 and the current source 280 are shared among a plurality of pixels, and thus it is possible to reduce the number of current sources which operate at the same time. For this reason, a plurality of current sources simultaneously operate, so that occurrence of voltage drops of the power supply voltage, rises of ground (GND) voltage, or the like can be reduced.

Also, compared to a case in which all the circuit elements of pixels are disposed in one substrate, the area of photoelectric conversion elements of the first substrate can be increased, and thus sensitivity is improved. Further, using sample hold capacities, it is possible to reduce the area of a region for signal accumulation provided in the second substrate 21.

Also, by providing the sample hold capacities 231, 232, 233, and 234, it is possible to reduce degradation of signal quality. In particular, by making the capacitor values of the sample hold capacities larger than the capacitor value of the charge holding unit (for example, by making the capacitor values of the sample hold capacities five times the capacitor value of the charge holding unit or more), signal charges held by the sample hold capacities become greater than signal charges held by the charge holding unit. For this reason, it is possible to reduce influence of signal degradation caused by leakage current of the sample hold capacities.

Also, by providing the clamp capacitor 260 and the second transmission transistors 271, 272, 273, and 274, it is possible to reduce influence of noise generated in the first substrate 20. The noise generated in the first substrate 20 is noise (for example, reset noise) resulting from operation of a circuit (for example, the first reset transistor 220) connected to the first amplification transistor 240 and generated in the input portion of the first amplification transistor 240, noise (for example, noise caused by irregularity of a circuit threshold of the first amplification transistor 240) resulting from operational characteristics of the first amplification transistor 240, or the like.

Also, by outputting signals upon resetting the sample hold capacities 231, 232, 233, and 234 and signals corresponding to changes in the output of the first amplification transistor 240 made by transferring the signal charges from the photoelectric conversion elements 201, 202, 203, and 204 to the charge holding unit 230 from pixels 100 in a time division manner and performing differential processing of each signal outside the pixels 100, it is possible to reduce influence of noise generated in the second substrate 21. The noise generated in the second substrate 21 is noise (for example, reset noise) resulting from operation of circuits (for example, the second reset transistors 221, 222, 223, and 224) connected to the second amplification transistors 241, 242, 243, and 244 and generated in the input portions of the second amplification transistors 241, 242, 243, and 244, or the like.

Figure 7:
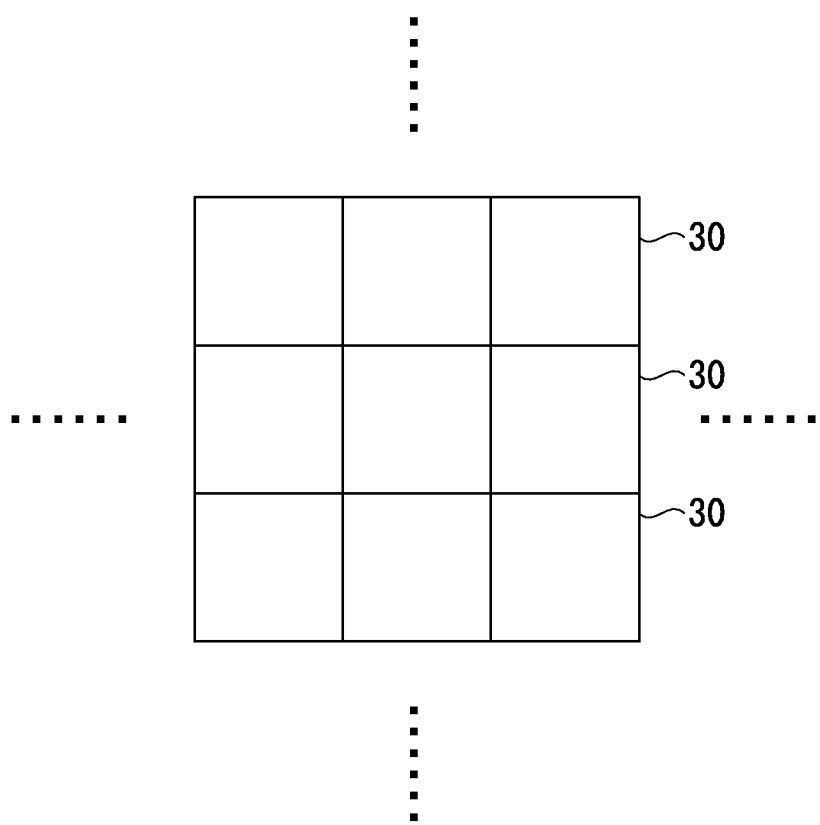
FIG. 7 is a reference diagram showing the disposition of pixel groups consisting of a plurality of pixels of a solid-state image capture device relating to an embodiment of the present invention.

Next, detailed structures of the sample hold capacities 231, 232, 233, and 234 and the clamp capacitor 260 are described. FIG. 7 shows a planar arrangement of a pixel group 30 consisting of nine pixels 100, which share the charge holding unit 230, the first reset transistor 220, the first amplification transistor 240, the current source 280, and the clamp capacitor 260, in the second substrate 21. As shown in FIG. 7, the pixel group 30 is disposed in the form of a two-dimensional matrix.

Figure 8A:
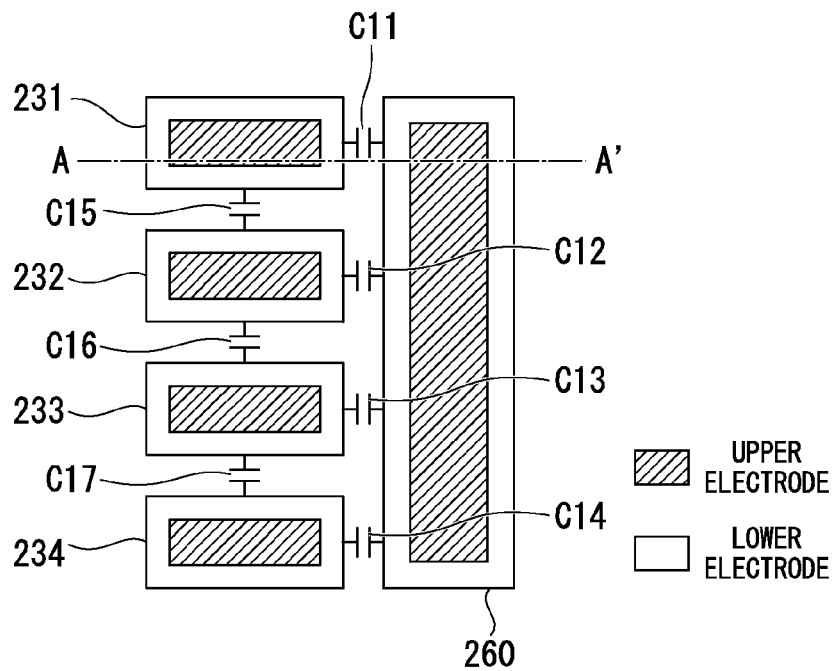
FIG. 8A is a plan view of sample hold capacities and a clamp capacitor of a solid-state image capture device relating to an embodiment of the present invention.
Figure 8B:
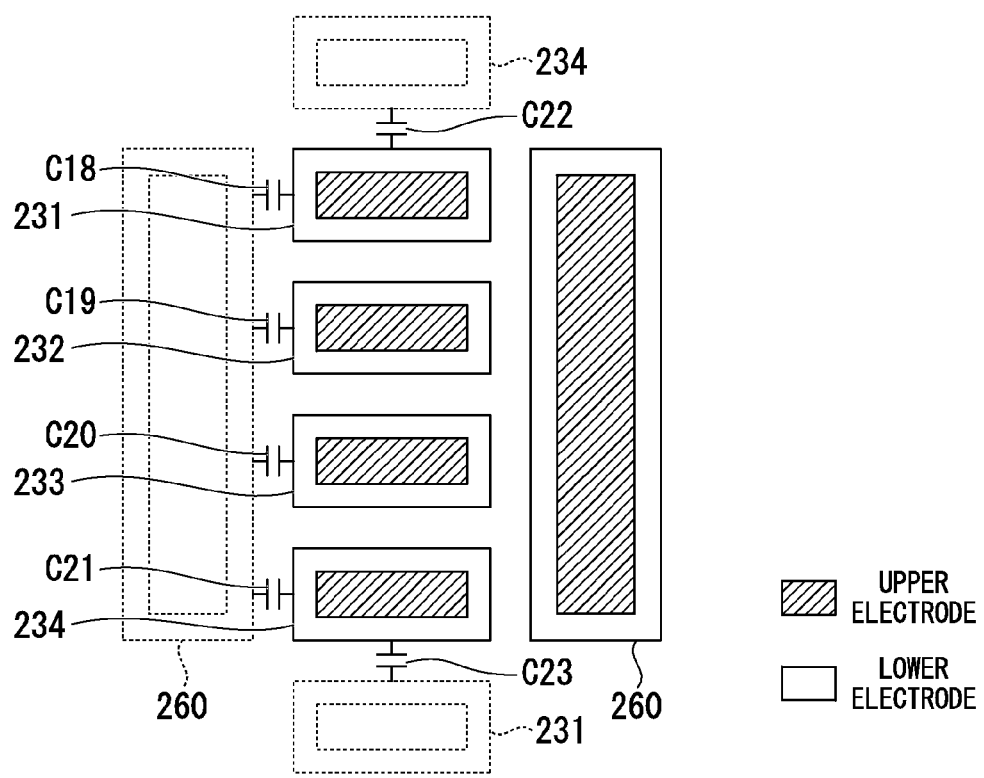
FIG. 8B is a plan view of sample hold capacities and a clamp capacitor of a solid-state image capture device relating to an embodiment of the present invention.
Figure 9:
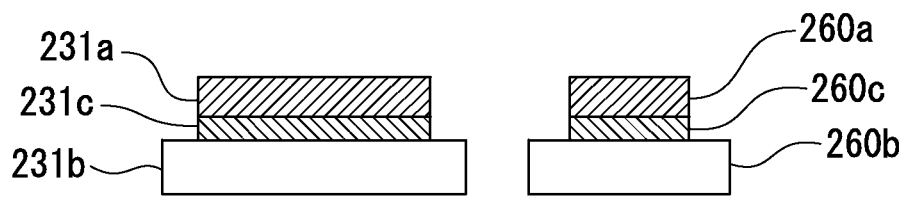
FIG. 9 is a cross-sectional view of a sample hold capacitor and a clamp capacitor of a solid-state image capture device relating to an embodiment of the present invention.

FIG. 8A, FIG. 8B, and FIG. 9 show a structure of the one pixel group 30. FIG. 8A and FIG. 8B show an example of the disposition of the sample hold capacities 231, 232, 233, and 234 and the clamp capacitor 260 when the second substrate 21 is seen two-dimensionally. The four sample hold capacities 231, 232, 233, and 234 corresponding to the respective nine pixels 100 constituting the one pixel group 30 and the clamp capacitor 260 shared by the nine pixels have a structure in which two sheets of flat plate-shaped electrodes (an upper electrode and a lower electrode) formed of a metal are opposite to each other. In order to increase a gain for a signal, the area of the clamp capacitor 260 is larger than the areas of the sample hold capacities 231, 232, 233, and 234.

FIG. 9 shows a cross section along line A-A' of FIG. 8A. The sample hold capacitor 231 is formed so that an upper electrode 231a and a lower electrode 231b face each other through an insulating film 231c with a high dielectric constant. Also, the clamp capacitor 260 is formed so that an upper electrode 260a and a lower electrode 260b face each other through an insulating film 260c with a high dielectric constant. The lower electrode 231b has a larger area than the upper electrode 231a, and the lower electrode 260b has a larger area than the upper electrode 260a. The structures of the sample hold capacities 232, 233, and 234 are the same as the structure of the sample hold capacitor 231. Although not shown in the drawings, the sample hold capacities 231, 232, 233, and 234 and the clamp capacitor 260 are surrounded by an insulating film.

In FIG. 8A, parasitic capacitances C11, C12, C13, C14, C15, C16, and C17 are shown. The parasitic capacitance C11 is a parasitic capacitance between the sample hold capacitor 231 and the clamp capacitor 260. The parasitic capacitance C12 is a parasitic capacitance between the sample hold capacitor 232 and the clamp capacitor 260. The parasitic capacitance C13 is a parasitic capacitance between the sample hold capacitor 233 and the clamp capacitor 260. The parasitic capacitance C14 is a parasitic capacitance between the sample hold capacitor 234 and the clamp capacitor 260. The parasitic capacitance C15 is a parasitic capacitance between the sample hold capacitor 231 and the sample hold capacitor 232. The parasitic capacitance C16 is a parasitic capacitance between the sample hold capacitor 232 and the sample hold capacitor 233. The parasitic capacitance C17 is a parasitic capacitance between the sample hold capacitor 233 and the sample hold capacitor 234.

The upper electrode and the lower electrode of each of the sample hold capacities 231, 232, 233, and 234 and the clamp capacitor 260 are quadrangular (rectangular in the present embodiment) flat panel-shaped electrodes. The shapes and the areas of the upper electrodes of the sample hold capacities 231, 232, 233, and 234 are almost the same, and the shapes and the areas of the lower electrodes of the sample hold capacities 231, 232, 233, and 234 are also almost the same. The planar shape of each electrode does not become a rigid quadrangle due to conditions of a manufacturing process, but a structure in which the shape of each electrode at the time of design can be considered to be a quadrangle is included in the present embodiment. Also, a slight difference between the sizes of respective electrodes can be made due to conditions of the manufacturing process, but a structure in which the sizes of the respective electrodes at the time of design can be considered to be almost the same is included in the present embodiment.

Short sides (the shorter sides among the two pairs of opposing sides constituting the rectangle) of each of the upper electrodes and the lower electrodes of the sample hold capacities 231, 232, 233, and 234 are disposed along one long side (one of the longer sides among the two pairs of opposing sides constituting the rectangle) of the clamp capacitor 260. In other words, the sample hold capacities 231, 232, 233, and 234 are disposed with their short sides having almost the same length directed to the clamp capacitor 260. Also, the distances between the sample hold capacities 231, 232, 233, and 234 and the clamp capacitor 260 are almost the same. More specifically, the distances between the upper electrodes of the sample hold capacities 231, 232, 233, and 234 and the upper electrode of the clamp capacitor 260 are almost the same, and the distances between the lower electrodes of the sample hold capacities 231, 232, 233, and 234 and the lower electrode of the clamp capacitor 260 are also almost the same. For the above reasons, the parasitic capacitances C11, C12, C13, and C14 are almost the same.

The sample hold capacitor 231 and the sample hold capacitor 232 are disposed with their long sides having almost the same length opposite to each other. The sample hold capacitor 232 and the sample hold capacitor 233, and the sample hold capacitor 233 and the sample hold capacitor 234 are also disposed in the same state. Also, the distances between the respective sample hold capacities 231, 232, 233, and 234 are almost the same. More specifically, the distances between the upper electrodes of two sample hold capacities adjacent to each other in the up-down direction are almost the same, and the distances between the lower electrodes of two sample hold capacities adjacent to each other in the up-down direction are also almost the same. For the above reasons, the parasitic capacitances C15, C16, and C17 are almost the same.

In FIG. 8B, parasitic capacitances C18, C19, C20, C21, C22, and C23 are shown. Short sides on the opposite sides of short sides of the sample hold capacities 231, 232, 233, and 234 opposite to the clamp capacitor 260 are opposite to a clamp capacitor 260 in another adjacent pixel group 30. The parasitic capacitances C18, C19, C20, and C21 are parasitic capacitances between the sample hold capacities 231, 232, 233, and 234 and the clamp capacitor 260 in the other adjacent pixel group 30. The distances between the sample hold capacities 231, 232, 233, and 234 and the clamp capacitor 260 in the other adjacent pixel group 30 are almost the same. For the above reasons, the parasitic capacitances C18, C19, C20, and C21 are almost the same.

A long side on the opposite side of a long side of the sample hold capacitor 231 opposite to the sample hold capacitor 232 is opposite to a sample hold capacitor 234 in another adjacent pixel group 30. The parasitic capacitance C22 is a parasitic capacitance between the sample hold capacitor 231 and the sample hold capacitor 234 in the other adjacent pixel group 30. The distance between the sample hold capacitor 231 and the sample hold capacitor 234 in the other adjacent pixel group 30 is almost the same as the distance between the sample hold capacitor 231 and the sample hold capacitor 232 in the same pixel group 30. For the above reasons, the parasitic capacitance C22 is almost the same as the parasitic capacitances C15, C16, and C17.

A long side on the opposite side of a long side of the sample hold capacitor 234 opposite to the sample hold capacitor 233 is opposite to a sample hold capacitor 231 in another adjacent pixel group 30. The parasitic capacitance C23 is a parasitic capacitance between the sample hold capacitor 234 and the sample hold capacitor 231 in the other adjacent pixel group 30. The distance between the sample hold capacitor 234 and the sample hold capacitor 231 in the other adjacent pixel group 30 is almost the same as the distance between the sample hold capacitor 234 and the sample hold capacitor 233 in the same pixel group 30. For the above reasons, the parasitic capacitance C23 between the sample hold capacitor 234 and the sample hold capacitor 231 in the other adjacent pixel group 30 is almost the same as the parasitic capacitances C15, C16, and C17.

As described above, the parasitic capacitances C11, C12, C13, and C14 are almost the same, the parasitic capacitances C18, C19, C20, and C21 are almost the same, and the parasitic capacitances C15, C16, C17, C22, and C23 are almost the same. Therefore, parasitic capacitances added to the respective sample hold capacities 231, 232, 233, and 234 are uniform.

Figure 10:
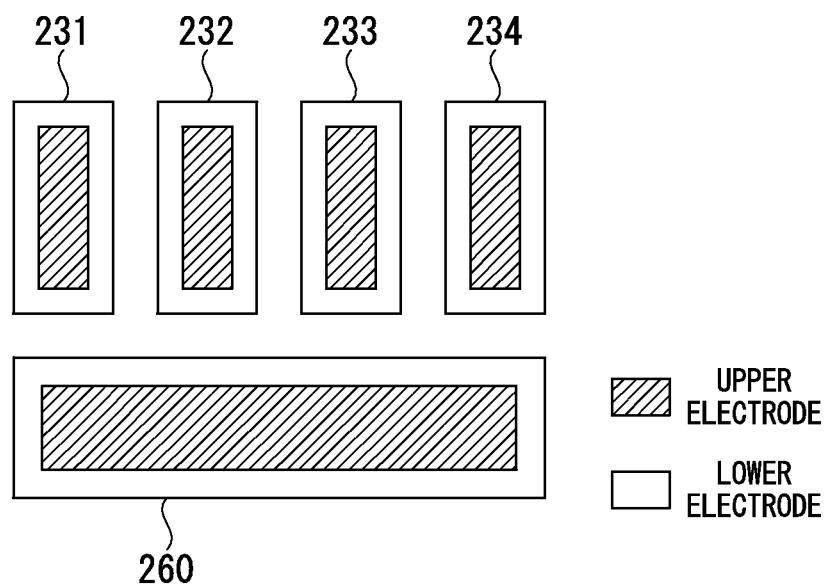
FIG. 10 is a plan view of sample hold capacities and a clamp capacitor of a solid-state image capture device relating to an embodiment of the present invention.

Next, a modified example of the disposition of the sample hold capacities 231, 232, 233, and 234 and the clamp capacitor 260 will be described. FIG. 10 shows another example of the disposition of the sample hold capacities 231, 232, 233, and 234 and the clamp capacitor 260 when the second substrate 21 is seen two-dimensionally. In FIG. 10, the sample hold capacities 231, 232, 233, and 234 and the clamp capacitor 260 are all rotated 90 degrees compared to FIG. 8A and FIG. 8B, but relative positional relationships of the sample hold capacities 231, 232, 233, and 234 and the clamp capacitor 260 are the same as FIG. 8A and FIG. 8B. Therefore, parasitic capacitances added to the respective sample hold capacities 231, 232, 233, and 234 are also uniform in FIG. 10.

Figure 11A:
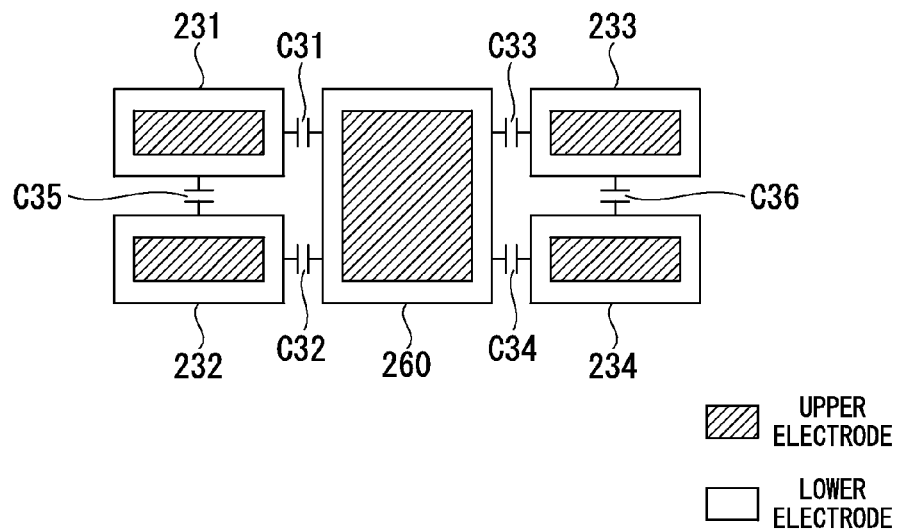
FIG. 11A is a plan view of sample hold capacities and a clamp capacitor of a solid-state image capture device relating to an embodiment of the present invention.
Figure 11B:
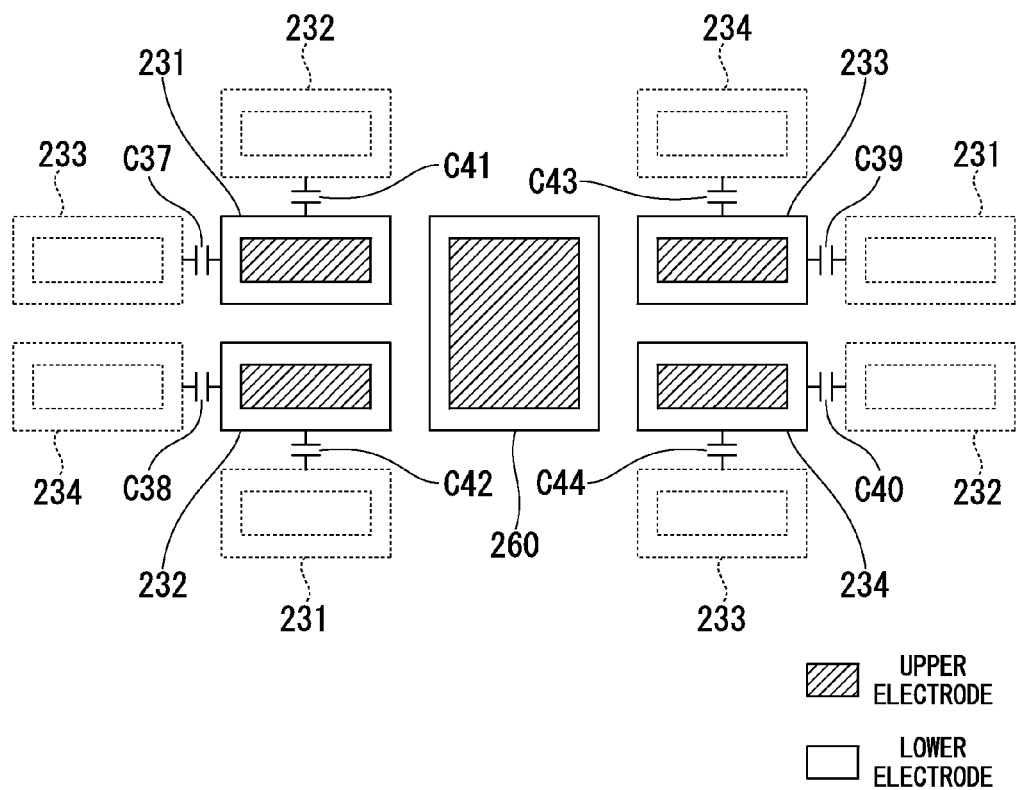
FIG. 11B is a plan view of sample hold capacities and a clamp capacitor of a solid-state image capture device relating to an embodiment of the present invention.

FIG. 11A and FIG. 11B show another example of the disposition of the sample hold capacities 231, 232, 233, and 234 and the clamp capacitor 260 when the second substrate 21 is seen two-dimensionally. The structures of the sample hold capacities 231, 232, 233, and 234 and the clamp capacitor 260 themselves are the same as the structures of the sample hold capacities 231, 232, 233, and 234 and the clamp capacitor 260 in FIG. 8A and FIG. 8B.

In FIG. 11A, parasitic capacitances C31, C32, C33, C34, C35, and C36 are shown. The parasitic capacitance C31 is a parasitic capacitance between the sample hold capacitor 231 and the clamp capacitor 260. The parasitic capacitance C32 is a parasitic capacitance between the sample hold capacitor 232 and the clamp capacitor 260. The parasitic capacitance C33 is a parasitic capacitance between the sample hold capacitor 233 and the clamp capacitor 260. The parasitic capacitance C34 is a parasitic capacitance between the sample hold capacitor 234 and the clamp capacitor 260. The parasitic capacitance C35 is a parasitic capacitance between the sample hold capacitor 231 and the sample hold capacitor 232. The parasitic capacitance C36 is a parasitic capacitance between the sample hold capacitor 233 and the sample hold capacitor 234.

Short sides of each of the upper electrodes and the lower electrodes of the sample hold capacities 231 and 232 are disposed along one side of the clamp capacitor 260. In other words, the sample hold capacities 231 and 232 are disposed with their short sides having almost the same length directed to the clamp capacitor 260. Also, short sides of each of the upper electrodes and the lower electrodes of the sample hold capacities 233 and 234 are disposed along another side of the clamp capacitor 260. In other words, the sample hold capacities 233 and 234 are disposed with their short sides having almost the same length directed to the clamp capacitor 260. The sample hold capacities 231 and 232 are disposed along one side between two opposing sides of the clamp capacitor 260, and the sample hold capacities 233 and 234 are disposed along the other side between two opposing sides of the clamp capacitor 260.

Also, the distances between the sample hold capacities 231, 232, 233, and 234 and the clamp capacitor 260 are almost the same. More specifically, the distances between the upper electrodes of the sample hold capacities 231, 232, 233, and 234 and the upper electrode of the clamp capacitor 260 are almost the same, and the distances between the lower electrodes of the sample hold capacities 231, 232, 233, and 234 and the lower electrode of the clamp capacitor 260 are also almost the same. For the above reasons, the parasitic capacitances C31, C32, C33, and C34 are almost the same.

The sample hold capacitor 231 and the sample hold capacitor 232 are disposed with their long sides having almost the same length opposite to each other. The sample hold capacitor 233 and the sample hold capacitor 234 are also disposed in the same state. Also, the distance between the sample hold capacities 231 and 232 and the distance between the sample hold capacities 233 and 234 are almost the same. More specifically, the distances between the upper electrodes of two sample hold capacities adjacent to each other in the up-down direction are almost the same, and the distances between the lower electrodes of two sample hold capacities adjacent to each other in the up-down direction are also almost the same. For the above reasons, the parasitic capacitances C35 and C36 are almost the same.

In FIG. 11B, parasitic capacitances C37, C38, C39, C40, C41, C42, C43, and C44 are shown. Short sides on the opposite sides of short sides of the sample hold capacities 231 and 232 opposite to the clamp capacitor 260 are opposite to sample hold capacities 233 and 234 in another adjacent pixel group 30. The parasitic capacitances C37 and C38 are parasitic capacitances between the sample hold capacities 231 and 232 and the sample hold capacities 233 and 234 in the other adjacent pixel group 30. Short sides on the opposite sides of short sides of the sample hold capacities 233 and 234 opposite to the clamp capacitor 260 are opposite to sample hold capacities 231 and 232 in another adjacent pixel group 30. The parasitic capacitances C39 and C40 are parasitic capacitances between the sample hold capacities 233 and 234 and the sample hold capacities 231 and 232 in the other adjacent pixel group 30.

The distances between the sample hold capacities 231 and 232 and the sample hold capacities 233 and 234 in the other adjacent pixel group 30 are almost the same as the distances between the sample hold capacities 233 and 234 and the sample hold capacities 231 and 232 in the other adjacent pixel group 30. For the above reasons, the parasitic capacitances C37, C38, C39, and C40 are almost the same.

A long side on the opposite side of a long side of the sample hold capacitor 231 opposite to the sample hold capacitor 232 is opposite to a sample hold capacitor 232 in another adjacent pixel group 30. The parasitic capacitance C41 is a parasitic capacitance between the sample hold capacitor 231 and the sample hold capacitor 232 in the other adjacent pixel group 30. A long side on the opposite side of a long side of the sample hold capacitor 232 opposite to the sample hold capacitor 231 is opposite to a sample hold capacitor 231 in another adjacent pixel group 30. The parasitic capacitance C42 is a parasitic capacitance between the sample hold capacitor 232 and the sample hold capacitor 231 in the other adjacent pixel group 30.

A long side on the opposite side of a long side of the sample hold capacitor 233 opposite to the sample hold capacitor 234 is opposite to a sample hold capacitor 234 in the other adjacent pixel group 30. The parasitic capacitance C43 is a parasitic capacitance between the sample hold capacitor 233 and the sample hold capacitor 234 in the other adjacent pixel group 30. A long side on the opposite side of a long side of the sample hold capacitor 234 opposite to the sample hold capacitor 233 is opposite to a sample hold capacitor 233 in the other adjacent pixel group 30. The parasitic capacitance C44 is a parasitic capacitance between the sample hold capacitor 234 and the sample hold capacitor 233 in the other adjacent pixel group 30.

The distance between the sample hold capacitor 231 and the sample hold capacitor 232 in the other adjacent pixel group 30, the distance between the sample hold capacitor 232 and the sample hold capacitor 231 in the other adjacent pixel group 30, the distance between the sample hold capacitor 233 and the sample hold capacitor 234 in the other adjacent pixel group 30, and the distance between the sample hold capacitor 234 and the sample hold capacitor 233 in the other adjacent pixel group 30 are all almost the same. For the above reasons, the parasitic capacitances C41, C42, C43, and C44 are all almost the same.

As described above, the parasitic capacitances C31, C32, C33, and C34 are almost the same, the parasitic capacitances C35 and C36 are almost the same, the parasitic capacitances C37, C38, C39, and C40 are almost the same, and the parasitic capacitances C41, C42, C43, and C44 are almost the same. Therefore, parasitic capacitances added to the respective sample hold capacities 231, 232, 233, and 234 are uniform.

Figure 12A:
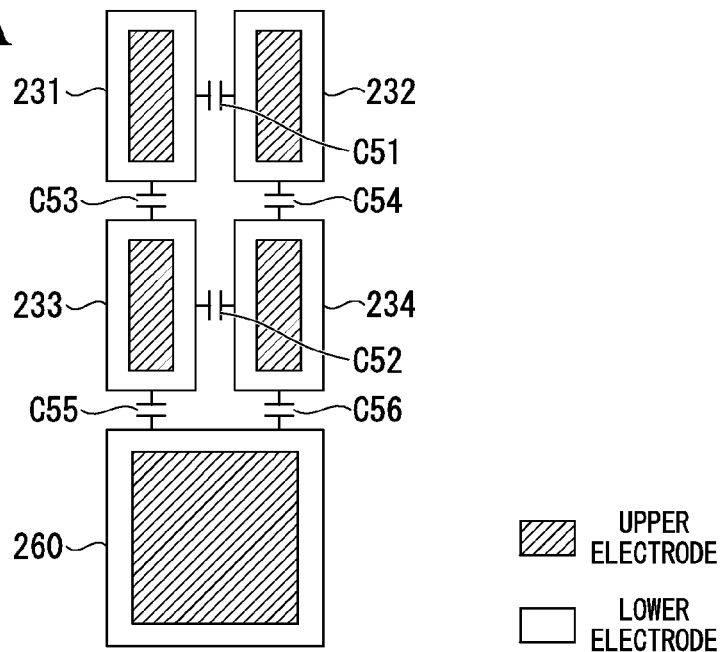
FIG. 12A is a plan view of sample hold capacities and a clamp capacitor of a solid-state image capture device relating to an embodiment of the present invention.
Figure 12B:
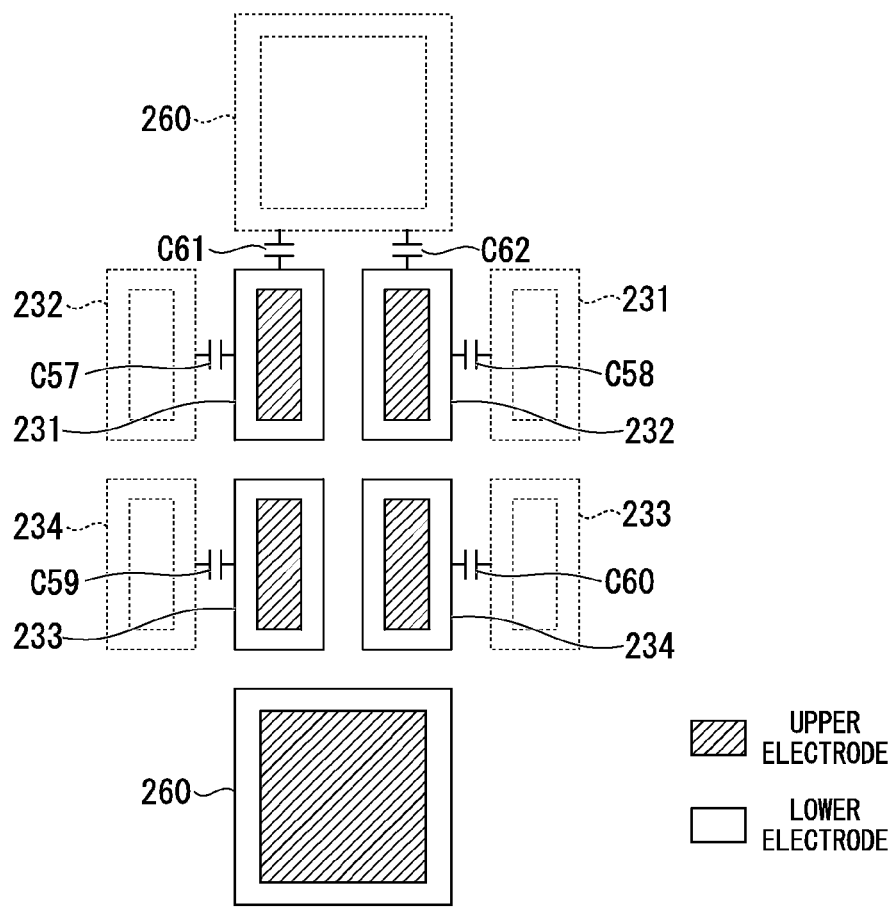
FIG. 12B is a plan view of sample hold capacities and a clamp capacitor of a solid-state image capture device relating to an embodiment of the present invention.

FIG. 12A and FIG. 12B show another example of the disposition of the sample hold capacities 231, 232, 233, and 234 and the clamp capacitor 260 when the second substrate 21 is seen two-dimensionally. The structures of the sample hold capacities 231, 232, 233, and 234 and the clamp capacitor 260 themselves are the same as the structures of the sample hold capacities 231, 232, 233, and 234 and the clamp capacitor 260 in FIG. 8A and FIG. 8B.

In FIG. 12A, parasitic capacitances C51, C52, C53, C54, C55, and C56 are shown. The parasitic capacitance C51 is a parasitic capacitance between the sample hold capacitor 231 and the sample hold capacitor 232. The parasitic capacitance C52 is a parasitic capacitance between the sample hold capacitor 233 and the sample hold capacitor 234. The parasitic capacitance C53 is a parasitic capacitance between the sample hold capacitor 231 and the sample hold capacitor 233. The parasitic capacitance C54 is a parasitic capacitance between the sample hold capacitor 232 and the sample hold capacitor 234. The parasitic capacitance C55 is a parasitic capacitance between the sample hold capacitor 233 and the clamp capacitor 260. The parasitic capacitance C56 is a parasitic capacitance between the sample hold capacitor 234 and the clamp capacitor 260.

The sample hold capacities 231 and 232 are disposed with their long sides having almost the same length opposite to each other. The sample hold capacities 233 and 234 are also disposed in the same state. Also, the distance between the sample hold capacitor 231 and the sample hold capacitor 232 and the distance between the sample hold capacitor 233 and the sample hold capacitor 234 are almost the same. More specifically, the distances between the upper electrodes of two sample hold capacities adjacent to each other in the left-right direction are almost the same, and the distances between the lower electrodes of two sample hold capacities adjacent to each other in the left-right direction are also almost the same. For the above reasons, the parasitic capacitances C51 and C52 are almost the same.

The sample hold capacities 231 and 233 are disposed with their short sides having almost the same length opposite to each other. The sample hold capacities 232 and 234 are also disposed in the same state. Also, the distance between the sample hold capacitor 231 and the sample hold capacitor 233 and the distance between the sample hold capacitor 232 and the sample hold capacitor 234 are almost the same. More specifically, the distances between the upper electrodes of two sample hold capacities adjacent to each other in the up-down direction are almost the same, and the distances between the lower electrodes of two sample hold capacities adjacent to each other in the up-down direction are also almost the same. For the above reasons, the parasitic capacitances C53 and C54 are almost the same.

Short sides of each of the upper electrodes and the lower electrodes of the sample hold capacities 233 and 234 are disposed along one side of the clamp capacitor 260. In other words, the sample hold capacities 233 and 234 are disposed with their short sides having almost the same length directed to the clamp capacitor 260. The distances between the sample hold capacities 233 and 234 and the clamp capacitor 260 are almost the same. More specifically, the distances between the upper electrodes of the sample hold capacities 233 and 234 and the upper electrode of the clamp capacitor 260 are almost the same, and the distances between the lower electrodes of the sample hold capacities 233 and 234 and the lower electrode of the clamp capacitor 260 are also almost the same. For the above reasons, the parasitic capacitances C55 and C56 are almost the same.

In FIG. 12B, parasitic capacitances C57, C58, C59, C60, C61, and C62 are shown. A long side on the opposite side of a long side of the sample hold capacitor 231 opposite to the sample hold capacitor 232 is opposite to a sample hold capacitor 232 in another adjacent pixel group 30. The parasitic capacitance C57 is a parasitic capacitance between the sample hold capacitor 231 and the sample hold capacitor 232 in the other adjacent pixel group 30. A long side on the opposite side of a long side of the sample hold capacitor 232 opposite to the sample hold capacitor 231 is opposite to a sample hold capacitor 231 in the other adjacent pixel group 30. The parasitic capacitance C58 is a parasitic capacitance between the sample hold capacitor 232 and the sample hold capacitor 231 in the other adjacent pixel group 30.

A long side on the opposite side of a long side of the sample hold capacitor 233 opposite to the sample hold capacitor 234 is opposite to a sample hold capacitor 234 in another adjacent pixel group 30. The parasitic capacitance C59 is a parasitic capacitance between the sample hold capacitor 233 and the sample hold capacitor 234 in the other adjacent pixel group 30. A long side on the opposite side of a long side of the sample hold capacitor 234 opposite to the sample hold capacitor 233 is opposite to a sample hold capacitor 233 in the other adjacent pixel group 30. The parasitic capacitance C60 is a parasitic capacitance between the sample hold capacitor 234 and the sample hold capacitor 233 in the other adjacent pixel group 30.

The distance between the sample hold capacitor 231 and the sample hold capacitor 232 in the other adjacent pixel group 30, the distance between the sample hold capacitor 232 and the sample hold capacitor 231 in the other adjacent pixel group 30, the distance between the sample hold capacitor 233 and the sample hold capacitor 234 in the other adjacent pixel group 30, and the distance between the sample hold capacitor 234 and the sample hold capacitor 233 in the other adjacent pixel group 30 are all almost the same. For the above reasons, the parasitic capacitances C57, C58, C59, and C60 are all almost the same.

A short side on the opposite side of a short side of the sample hold capacitor 231 opposite to the sample hold capacitor 233 is opposite to a clamp capacitor 260 in another adjacent pixel group 30. The parasitic capacitance C61 is a parasitic capacitance between the sample hold capacitor 231 and the clamp capacitor 260 in the other adjacent pixel group 30. A short side on the opposite side of a short side of the sample hold capacitor 232 opposite to the sample hold capacitor 234 is opposite to the clamp capacitor 260 in the other adjacent pixel group 30. The parasitic capacitance C62 is a parasitic capacitance between the sample hold capacitor 232 and the clamp capacitor 260 in the other adjacent pixel group 30.

The distances between the sample hold capacities 231 and 232 and the clamp capacitor 260 in the other adjacent pixel group 30 are almost the same. More specifically, the distances between the upper electrodes of the sample hold capacities 231 and 232 and the upper electrode of the clamp capacitor 260 in the other adjacent pixel group 30 are almost the same, and the distances between the lower electrodes of the sample hold capacities 231 and 232 and the lower electrode of the clamp capacitor 260 in the other adjacent pixel group 30 are also almost the same. Further, the distances between the sample hold capacities 231 and 232 and the clamp capacitor 260 in the other adjacent pixel group 30 are almost the same as the distances between the sample hold capacities 233 and 234 and the clamp capacitor 260 in the same pixel group 30. For the above reasons, the parasitic capacitances C61 and C62 are almost the same as the parasitic capacitances C55 and C56.

As described above, the parasitic capacitances C51 and C52 are almost the same, the parasitic capacitances C53 and C54 are almost the same, the parasitic capacitances C55, C56, C61, and C62 are almost the same, and the parasitic capacitances C57, C58, C59, and C60 are almost the same. Therefore, parasitic capacitances added to the respective sample hold capacities 231, 232, 233, and 234 are uniform.

As described above, according to the present embodiment, by disposing the sample hold capacities 231, 232, 233, and 234 and the clamp capacitor 260 to satisfy all the following conditions, it is possible to uniformize parasitic capacitances added to the sample hold capacities 231, 232, 233, and 234. Therefore, gains for signals generated in the pixel group 30 can be uniformized.

(1) There are a plurality of combinations of two sample hold capacities which are adjacent in the left-right direction or the up-down direction in one pixel group 30, and the distance between these two sample hold capacities is the same for any combination.

(2) There are a plurality of combinations of two sample hold capacities which are adjacent in the left-right direction or the up-down direction in one pixel group 30, and the lengths of one sides of these two sample hold capacities opposite to each other are the same for any combination.

(3) The distances between respective sample hold capacities and the clamp capacitor 260 in the same pixel group 30 or a clamp capacitor 260 in an adjacent pixel group 30 are the same.

(4) The lengths of one sides of the respective sample hold capacities 231, 232, 233, and 234 opposite to the clamp capacitor 260 in the same pixel group 30 or a clamp capacitor 260 in an adjacent pixel group 30 are the same.

Figure 13A:
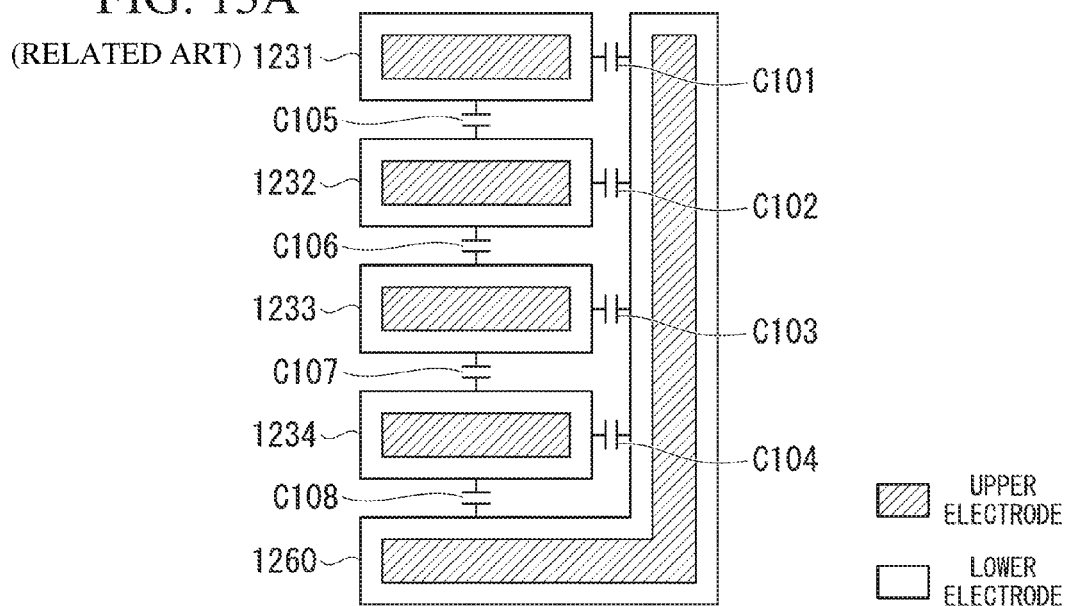
FIG. 13A is a plan view of sample hold capacities and a clamp capacitor of a solid-state image capture device.
Figure 13B:
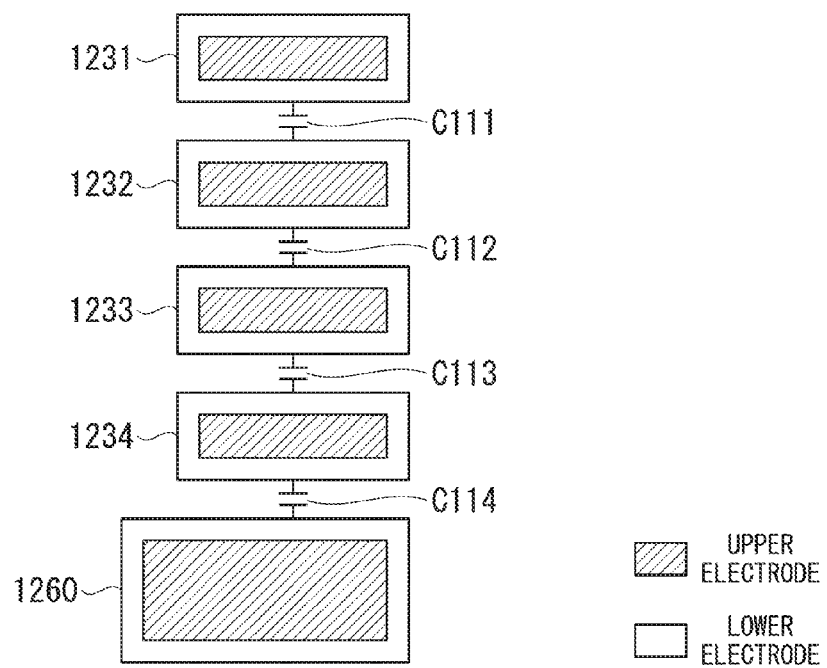
FIG. 13B is a plan view of sample hold capacities and a clamp capacitor of a solid-state image capture device.

In the disposition shown in FIG. 13A, since only a short side of, for example, the sample hold capacitor 1233 is opposite to the clamp capacitor 1260 and a short side and a long side of the sample hold capacitor 1234 are opposite to the clamp capacitor 1260, the condition of (4) is not satisfied. Also, in the disposition shown in FIG. 13B, since the distance between, for example, the sample hold capacitor 1234 and the clamp capacitor 1260 and the distance between the sample hold capacitor 1233 and the clamp capacitor 1260 are different, the condition of (3) is not satisfied.

Embodiments of the present invention have been described above in detail with reference to the drawings, but a detailed constitution is not limited to the embodiments and includes changes of design and the like within a range not departing from the gist of the present invention.

The present invention can be widely applied to solid-state image capture devices and image capture devices, and it is possible to uniformize parasitic capacitances added to a plurality of sample hold capacities included in a plurality of pixels sharing a clamp capacitor by equalizing the distances between two adjacent sample hold capacities, the lengths of one sides of two adjacent sample hold capacities, the distances between the respective sample hold capacities and the clamp capacitor, and the lengths of one sides opposite to the clamp capacitor.

What is claimed is:

1. A solid-state image capture device comprising a plurality of pixels and a first substrate and a second substrate in which circuit elements constituting the pixels are disposed and which are electrically connected by a connection unit,
   wherein the pixels comprise:
   photoelectric conversion elements disposed in the first substrate and generating signals corresponding to amounts of incident light;
   sample and hold capacitors disposed in the second substrate and holding output signals corresponding to the signals generated by the photoelectric conversion elements; and
   a clamp capacitor disposed in the second substrate, shared by the plurality of pixels, and clamping voltages of the output signals held in the plurality of sample and hold capacitors,
   the sample and hold capacitors and the clamp capacitor are capacitors having a structure in which two sheets of metal electrodes having a quadrangular flat plate shape are opposite to each other, and
   in the plurality of pixels sharing the clamp capacitor,
   distances between two adjacent sample and hold capacitors are identical,
   lengths of one sides of two adjacent sample and hold capacitors are identical,
   distances between the respective sample and hold capacitors and the clamp capacitor are identical, and
   lengths of one sides of the sample and hold capacitors opposite to the clamp capacitor are identical.

2. The solid-state image capture device of claim 1, wherein the plurality of sample and hold capacitors included in the plurality of pixels sharing the clamp capacitor are disposed along one identical side of the clamp capacitor.

3. The solid-state image capture device of claim 1, wherein some of the sample and hold capacitors among the plurality of sample and hold capacitors included in the plurality of pixels sharing the clamp capacitor are disposed along a first side of the clamp capacitor, and remaining sample and hold capacitors are disposed along a second side of the clamp capacitor different from the first side.

4. The solid-state image capture device of claim 3, wherein a number of sample and hold capacitors disposed along the first side of the clamp capacitor is equal to a number of sample and hold capacitors disposed along the second side of the clamp capacitor.

5. The solid-state image capture device of claim 1, wherein,
   in units of groups including the clamp capacitor and the plurality of sample and hold capacitors included in the plurality of pixels sharing the clamp capacitor, the clamp capacitor and the sample and hold capacitors are disposed in two dimensions,
   some sample and hold capacitors among the plurality of sample and hold capacitors included in the plurality of pixels sharing the clamp capacitor included in a first group are disposed along one side of the clamp capacitor included in the first group, and remaining sample and hold capacitors are disposed along one side of the clamp capacitor included in a second group different from the first group.

6. The solid-state image capture device of claim 5, wherein a number of sample and hold capacitors disposed along the one side of the clamp capacitor included in the first group and a number of sample and hold capacitors disposed along the one side of the clamp capacitor included in the second group are identical.

7. An image capture device comprising a solid-state image capture device, the solid-state image capture device including a plurality of pixels and a first substrate and a second substrate in which circuit elements constituting the pixels are disposed and which are electrically connected by a connection unit,
   wherein the pixels comprise:
   photoelectric conversion elements disposed in the first substrate and generating signals corresponding to amounts of incident light;
   sample and hold capacitors disposed in the second substrate and holding output signals corresponding to the signals generated by the photoelectric conversion elements; and
   a clamp capacitor disposed in the second substrate, shared by the plurality of pixels, and clamping voltages of the output signals held in the plurality of sample and hold capacitors,
   the sample and hold capacitors and the clamp capacitor are capacitors having a structure in which two sheets of metal electrodes having a quadrangular flat plate shape are opposite to each other, and
   in the plurality of pixels sharing the clamp capacitor,
   distances between two adjacent sample and hold capacitors are identical,
   lengths of one sides of two adjacent sample and hold capacitors are identical,
   distances between the respective sample and hold capacitors and the clamp capacitor are identical, and
   lengths of one sides of the sample and hold capacitors opposite to the clamp capacitor are identical.

* * * * *